(12) United States Patent
Lee et al.

(10) Patent No.: US 12,538,632 B2
(45) Date of Patent: Jan. 27, 2026

(54) SOLAR CELL AND MANUFACTURING METHOD THEREOF

(71) Applicant: JINGAO SOLAR CO., LTD., Hebei (CN)

(72) Inventors: Kyungdong Lee, Seoul (KR); Giwon Lee, Seoul (KR); Hyunho Kim, Seoul (KR); Ilhyoung Jung, Seoul (KR)

(73) Assignee: JINGAO SOLAR CO., LTD., Xingtai (CN)

( * ) Notice: Subject to any disclaimer, the term of this patent is extended or adjusted under 35 U.S.C. 154(b) by 0 days.

(21) Appl. No.: 18/562,830

(22) PCT Filed: Oct. 19, 2021

(86) PCT No.: PCT/KR2021/014559
§ 371 (c)(1),
(2) Date: Nov. 21, 2023

(87) PCT Pub. No.: WO2023/054786
PCT Pub. Date: Apr. 6, 2023

(65) Prior Publication Data
US 2024/0237368 A1 Jul. 11, 2024

(30) Foreign Application Priority Data
Sep. 29, 2021 (KR) .............. 10-2021-0128831

(51) Int. Cl.
*H10K 30/57* (2023.01)
*H10K 30/40* (2023.01)
(Continued)

(52) U.S. Cl.
CPC .............. *H10K 30/57* (2023.02); *H10K 30/40* (2023.02); *H10K 30/86* (2023.02); *H10K 71/00* (2023.02); *H10K 71/30* (2023.02); *H10K 85/633* (2023.02)

(58) Field of Classification Search
CPC ...... H10K 30/57; H10K 85/633; H10K 71/00; H10K 30/40; H10K 30/86; H10K 71/30
See application file for complete search history.

(56) References Cited

U.S. PATENT DOCUMENTS

2016/0163904 A1* 6/2016 Mailoa .................... H10F 10/16
438/74
2023/0092881 A1* 3/2023 Lee ........................ H10F 10/19
136/256

FOREIGN PATENT DOCUMENTS

| CN | 104795420 A | 7/2015 |
|---|---|---|
| CN | 109196678 A | 1/2019 |

(Continued)

OTHER PUBLICATIONS

Japanese Office Action for Application No. 2023-573410, mailed Dec. 17, 2024 (12 pages).
(Continued)

*Primary Examiner* — Tae-Sik Kang
(74) *Attorney, Agent, or Firm* — Wiersch Law Group

(57) ABSTRACT

A solar cell manufacturing method according to this embodiment includes: forming a second photoelectric conversion portion including a semiconductor substrate, a first semiconductor layer on one side of the semiconductor substrate, and a second semiconductor layer having a different conductivity type from the first semiconductor layer on the other side of the semiconductor substrate; forming a junction layer on the first semiconductor layer; changing a surface property of a front surface of the junction layer; forming a first photoelectric conversion portion including a photoelectric conversion layer including a perovskite compound on the front surface of the junction layer; and forming a first electrode electrically connected to the first photoelectric conversion portion on one side of the first photoelectric conversion portion and a second electrode electrically con-
(Continued)

nected to the second photoelectric conversion portion on the other side of the second photoelectric conversion portion. Therefore, in a tandem structure provided with the first photoelectric conversion portion including the perovskite compound and the second photoelectric conversion portion including the semiconductor substrate, an adhesion property can be improved by changing the junction layer between the first photoelectric conversion portion and the second photoelectric conversion portion to hydrophilicity.

19 Claims, 16 Drawing Sheets

(51) Int. Cl.
*H10K 30/86* (2023.01)
*H10K 71/00* (2023.01)
*H10K 71/30* (2023.01)
*H10K 85/60* (2023.01)

(56) References Cited

FOREIGN PATENT DOCUMENTS

| | | | |
|---|---|---|---|
| CN | 112086535 | A | 12/2020 |
| CN | 115380391 | A | 11/2022 |
| JP | 2006148134 | A | 6/2006 |
| JP | 2015138861 | A | 7/2015 |
| KR | 20110068217 | A | 6/2011 |
| KR | 20130006868 | A | 1/2013 |
| KR | 20150124413 | A | 11/2015 |
| KR | 20170002967 | A | 1/2017 |
| KR | 20210112160 | A | 9/2021 |
| WO | 2017195722 | A1 | 11/2017 |
| WO | WO-2021177552 | A1 * | 9/2021 ........... H01G 9/2045 |

OTHER PUBLICATIONS

Surface Engineering of PTAA by adding Al2O3 interfacial layer for Inverted Perovskite Solar Cell.
International Search Report (PCT/KR2021/014559 ); Date of Mailing: Jun. 20, 2022.

* cited by examiner

| Instance | Process condition | Contact angle result | Angle value |
|---|---|---|---|
| Back surface of junction layer | ICO |  | 68.3° |
| 1 | $CH_4$ |  | 92.8° ~ 93.6° |
| 2 | $CH_4/H_2$ |  | 95.7° ~ 100.6° |
| 4 | $CH_4/N_2$ |  | 91.7° |

| Number | Result |
|---|---|
| 1 |  |
| 2 |  |
| 3 |  |

SOLAR CELL AND MANUFACTURING METHOD THEREOF

TECHNICAL FIELD

The present disclosure relates to a solar cell and a manufacturing method thereof, and in particular, to a solar cell with an improved structure and a manufacturing method thereof.

BACKGROUND

A solar cell including a semiconductor substrate is widely used due to excellent efficiency. However, the solar cell including the semiconductor substrate has certain limitations in improving the efficiency, and solar cells of various structures capable of improving photoelectric conversion efficiency have been proposed.

As an example, a solar cell including a perovskite compound that absorbs short-wavelength light and performs photoelectric conversion using a short wavelength as a photoelectric conversion portion is proposed. In the solar cell including the perovskite compound as a photoelectric conversion portion, as described in Korean Laid-Open Patent No. 10-2016-0040925, excellent efficiency is generally achieved by stacking another photoelectric conversion portion composed of a different structure or material from a photoelectric conversion portion including a perovskite compound.

In a solar cell having such a structure, it is very important to enable a plurality of photoelectric conversion portion stacked on each other to have excellent connection properties in order to improve efficiency.

To this end, a multi-junction optoelectronic apparatus is disclosed in Korean Patent No. 10-2018-0026454. In the conventional technology as described above, a tandem solar cell in which a heterojunction structure is stacked with a perovskite solar cell is claimed, and as a junction layer of the two, that is, as a composite layer, a transparent conductive oxide (TCO) layer is applied.

However, in the structure as described above, due to a difference in surface energy between the TCO, which is a hydrophilic junction layer, and a material of a hydrophobic hole transport layer (HTL), bonding between the two surfaces becomes unstable.

Therefore, an HTL process is accompanied by an inevitable spin coating process or wet process, or other different connection processes are required.

RELATED ART REFERENCES

Patent References

Korean Laid-Open Patent No. 10-2016-0040925 (Apr. 15, 2016)
Korean Laid-Open Patent No. 10-2018-0026454 (Mar. 16, 2018)

SUMMARY

Technical Problem

This embodiment is intended to provide a solar cell with excellent efficiency and a manufacturing method thereof. In particular, this embodiment is intended to provide a solar cell having a tandem structure, which is provided with a photoelectric conversion portion including a perovskite compound and another photoelectric conversion portion having a different material or structure, and having excellent efficiency and a manufacturing method thereof.

More particularly, this embodiment is intended to provide a solar cell having excellent efficiency by smoothing movement of carriers while improving bonding properties between two photoelectric conversion portions in a tandem structure provided with a plurality of photoelectric conversion portions and a manufacturing method thereof.

In addition, this embodiment is intended to provide a solar cell that can be manufactured through a simple process to improve productivity and a manufacturing method thereof.

Means of Solving the Technical Problem

A solar cell according to this embodiment includes a photoelectric conversion portion, a junction layer, a first electrode, and a second electrode. The photoelectric conversion portion includes a first photoelectric conversion portion including a photoelectric conversion layer formed of a perovskite compound, and a second photoelectric conversion portion including a semiconductor substrate, the junction layer is formed between the first photoelectric conversion portion and the second photoelectric conversion portion, the first electrode is electrically connected to the photoelectric conversion portion on one side of the photoelectric conversion portion, and the second electrode is electrically connected to the photoelectric conversion portion on the other side of the photoelectric conversion portion. The junction layer includes a back surface in contact with the second photoelectric conversion portion and a front surface in contact with the first photoelectric conversion portion, and the back surface and the front surface have different surface properties.

The second photoelectric conversion portion may include the semiconductor substrate, a first-conductivity-type first semiconductor layer on one side of the semiconductor substrate, and a second-conductivity-type second semiconductor layer on the other side of the semiconductor substrate.

The back surface of the junction layer may have a hydrophilic surface property, and the front surface of the junction layer may have a hydrophobic surface property.

The junction layer may include a TCO layer formed on the first-conductivity-type first semiconductor layer and having a hydrophilic surface property.

A front surface of the TCO layer of the junction layer may be formed to have a hydrophobic surface property by plasma surface treatment.

The junction layer may further include an interface layer in contact with the first photoelectric conversion portion on the TCO layer.

The interface layer may include a doped semiconductor layer and has a hydrophobic surface property.

A tunneling layer may be further included between the semiconductor substrate and the second-conductivity-type second semiconductor layer, and the interface layer may be formed to be thinner than the tunneling layer.

The first photoelectric conversion portion may include the photoelectric conversion layer comprising the perovskite compound, a first transport layer formed above the photoelectric conversion layer, and a second transport layer formed below the photoelectric conversion layer, wherein the second transport layer may be formed to be bonded to the junction layer, and the second transport layer may have a hydrophobic surface property.

The second transport layer may include N-propyl bromide (NPB) or 2,2',7,7'-tetra(N,N-di-p-tolyl)amino-9,9-spirobifluorene (Spiro-TTB) having a hydrophobic surface property.

The first photoelectric conversion portion may be positioned on one side of the second photoelectric conversion portion, the first electrode may be positioned on the first photoelectric conversion portion, the second electrode may be positioned on the second semiconductor layer of the second photoelectric conversion portion, the second semiconductor layer may include a polycrystalline portion, and laminated structures of the first electrode and the second electrode may be different from each other.

In addition, a solar cell manufacturing method according to this embodiment of the present disclosure includes: a step of forming a second photoelectric conversion portion including a semiconductor substrate, a first semiconductor layer on one side of the semiconductor substrate, and a second semiconductor layer on the other side of the semiconductor substrate and having a different conductivity type from the first semiconductor layer; a step of forming a junction layer on the first semiconductor layer; a step of changing a surface property of a front surface of the junction layer; a step of forming a first photoelectric conversion portion including a photoelectric conversion layer formed of a perovskite compound on the front surface of the junction layer; and a step of forming a first electrode electrically connected to the first photoelectric conversion portion on one side of the first photoelectric conversion portion and a second electrode electrically connected to the second photoelectric conversion portion on the other side of the second photoelectric conversion portion.

In the step of forming a junction layer, a TCO layer having a hydrophilic surface property may be formed on the first semiconductor layer of the semiconductor substrate.

In the step of changing a surface property of the junction layer, treatment may be performed so that a back surface of the junction layer has a hydrophilic surface property and the front surface of the junction layer has a hydrophobic surface property.

In the step of changing a surface property of the junction layer, plasma surface treatment may be performed on a front surface of the TCO layer of the junction layer so as to be formed to have a hydrophobic surface property.

The plasma surface treatment may be performed at a temperature below 200° C. and is performed by CH4 plasma or fluorine plasma treatment.

The step of changing a surface property of the junction layer may further include: a step of forming, on the TCO layer, an interface layer in contact with the first photoelectric conversion portion.

The step of forming an interface layer may include: a step of depositing an amorphous silicon layer on the TCO layer; and a step of injecting a high-concentration dopant to the amorphous silicon layer to change the surface property to hydrophobicity.

A tunneling layer may be further included between the semiconductor substrate and the second semiconductor layer, and the interface layer may be formed to be thinner than the tunneling layer.

The first photoelectric conversion portion may be formed to include the photoelectric conversion layer comprising the perovskite compound, a first transport layer formed above the photoelectric conversion layer, and a second transport layer formed below the photoelectric conversion layer, wherein the second transport layer may be formed to be in contact with the junction layer, and the second transport layer may be formed by depositing a material having a hydrophobic surface property.

Invention Effect

According to this embodiment, in a tandem structure provided with the first photoelectric conversion portion including the perovskite compound and the second photoelectric conversion portion including the semiconductor substrate, an adhesion property can be improved by changing the junction layer between the first photoelectric conversion portion and the second photoelectric conversion portion to hydrophilicity.

In addition, the TCO layer may be applied as it is as a junction layer, thereby replacing a dry process in the absence of a wet process with process instability, so as to realize a tandem cell structure.

Therefore, in stacking of the junction layer and the first photoelectric conversion portion, matchability is improved, thereby facilitating a larger area.

Even if interlayer or plasma treatment is performed, the junction layer as described above may also have same optical and electrical properties of the TCO layer, hole mobility can be improved by improving bonding properties of the TCO layer and the HTL, and drive performance of tandem cells can be improved by increasing a fill factor (FF).

REFERENCE SIGNS

Figure 1:
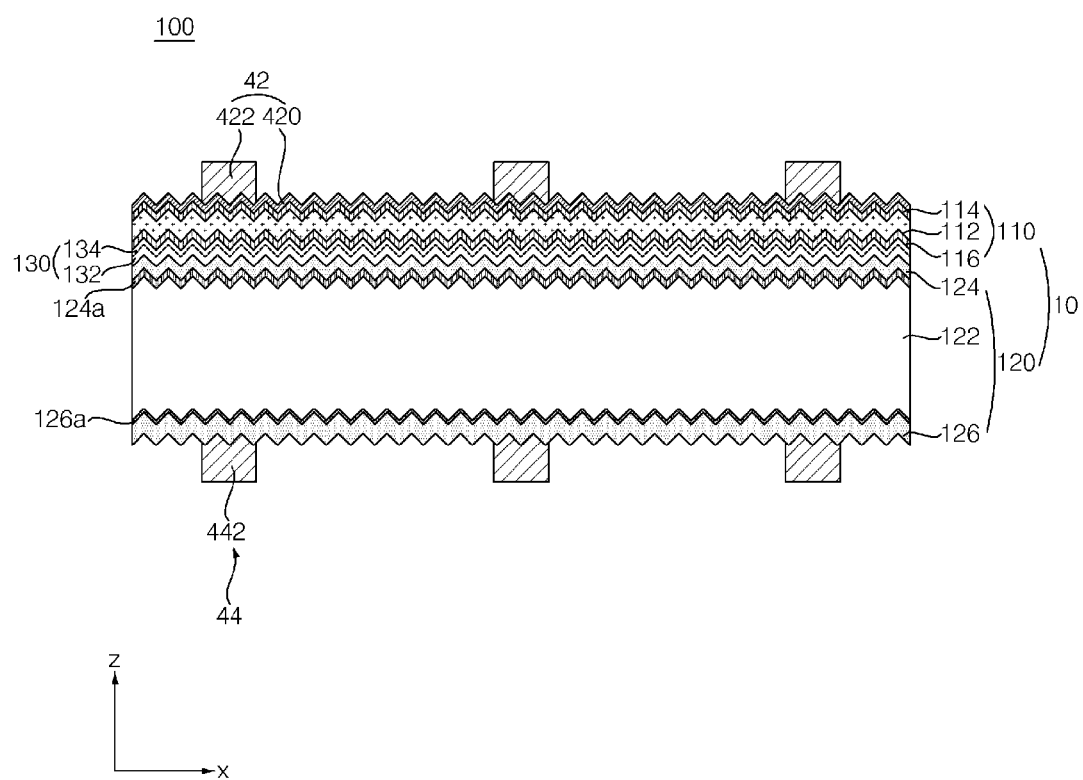
FIG. 1 is a sectional view schematically showing a solar cell according to some embodiments of the present disclosure.

100: solar cell
10: photoelectric conversion portion
110: first photoelectric conversion portion
112: photoelectric conversion layer
114: first transport layer
116: second transport layer
120: second photoelectric conversion portion
122: semiconductor substrate
124: first semiconductor layer
126: second semiconductor layer
42: first electrode
44: second electrode
130: junction layer
132: back/basic junction layer
136: interface layer

DESCRIPTION OF EMBODIMENTS

Embodiments of the present disclosure will be described in detail below with reference to the accompanying drawings. However, the present disclosure is not limited to such embodiments, and may be modified into various forms.

In order to clearly and briefly explain the present disclosure, illustration of parts irrelevant to the description in the accompanying drawings is omitted, and throughout the specification, same reference signs are used for same or very similar parts. In addition, in order to make the description clearer, the thickness, the width, and the like are enlarged or reduced and shown in the accompanying drawings, and the thickness, the width, and the like in the present disclosure are not limited to those shown in the accompanying drawings.

Moreover, throughout the specification, when a portion is referred to as "including" another portion, the another portion is not excluded and may be included unless otherwise specifically stated. In addition, when a portion of a layer, a film, a region, a panel, or the like is "on" another portion, this includes not only being "directly on" the another portion, but also having another portion positioned therebetween. When a portion of a layer, a film, a region, a panel, or the like is referred to as being "directly on" another portion, it means that no another portion is positioned therebetween.

A solar cell and a manufacturing method thereof according to some embodiments of the present disclosure will be described in detail below with reference to the accompanying drawings. In this specification, the expressions "first" or "second" are used only to distinguish one from the other, and the present disclosure is not limited thereto.

Figure 2:
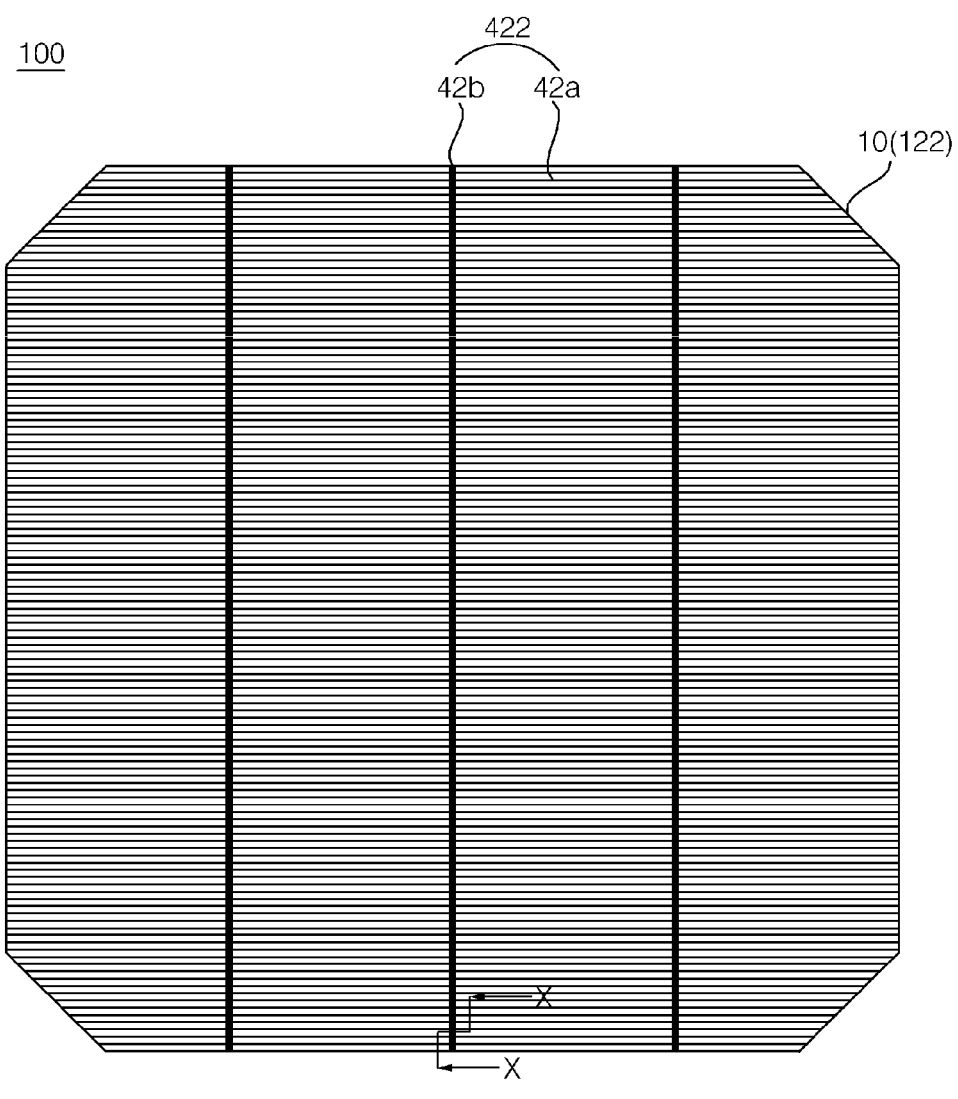
FIG. 2 is a front plan view showing a front surface of the solar cell shown in FIG. 1.
Figure 2:
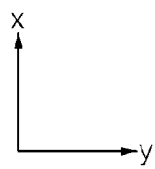

FIG. 1 is a sectional view schematically showing a solar cell according to some embodiments of the present disclosure, and FIG. 2 is a front plan view showing a front surface of the solar cell shown in FIG. 1. For clear understanding, in FIG. 2, illustration of a first electrode layer of a first electrode is omitted, and a second electrode layer is mainly shown.

Referring to FIG. 1, a solar cell 100 according to this embodiment may include a photoelectric conversion portion 10 including a first photoelectric conversion portion 110 and a second photoelectric conversion portion 120. That is, the photoelectric conversion portion 10 may have a tandem structure including a plurality of photoelectric conversion portions 110 and 120 stacked on each other. In this case, a junction layer (tunneling junction layer) 130 is located on one side (a front surface as an example) of the second photoelectric conversion portion 120 or on a first semiconductor layer 124, so as to electrically connect the second photoelectric conversion portion 120 with the first photoelectric conversion portion 110 thereabove. In FIG. 1, the junction layer 130 has a plurality of layered structures and is arranged between the first semiconductor layer 124 of the second photoelectric conversion portion 124 and a second transport layer 116 of the first photoelectric conversion portion 110, but the present disclosure is not limited thereto. Such a junction layer 130 may have a thin thickness so that tunneling of carriers may occur smoothly, and may be configured in multiple layers.

For example, the photoelectric conversion portion 10 may include a first photoelectric conversion portion 110 including a photoelectric conversion layer 112 formed of a perovskite compound, and a second photoelectric conversion portion 120 including a semiconductor substrate (a silicon substrate as an example) 122. In this case, the second photoelectric conversion portion 120 may include the semiconductor substrate 122, the first semiconductor layer 124 formed separately from the semiconductor substrate 122 on one side (a front surface as an example) of the semiconductor substrate 122, and a second semiconductor layer 126 formed separately from a semiconductor substrate (10) on the other side (a back surface as an example) of the semiconductor substrate 122. Then, the solar cell 100 may include a first electrode 42 electrically connected to the photoelectric conversion portion 10 on one side (a front surface as an example) of the photoelectric conversion portion 10, and a second electrode 44 electrically connected to the photoelectric conversion portion 10 on the other side (a back surface as an example) of the photoelectric conversion portion 10. A more detailed description thereof is as follows.

In this embodiment, in the second photoelectric conversion portion 120, the semiconductor substrate 122 may comprise a crystalline semiconductor (e.g., a monocrystalline or polycrystalline semiconductor, monocrystalline or polycrystalline silicon as an example) including a single semiconductor material (a Group IV element as an example). Then, based on the semiconductor substrate 122 with high crystallinity and few defects, the second photoelectric conversion portion 120 may have excellent electrical properties. For example, the semiconductor substrate 122 may comprise a monocrystalline semiconductor (monocrystalline silicon as an example), and thus has more excellent electrical properties. As described above, the second photoelectric conversion portion 120 may have a crystalline silicon solar cell structure including a crystalline semiconductor substrate 122.

A front surface and/or a back surface of the semiconductor substrate 122 may be textured to have an uneven or antireflection structure. As an example, the uneven or antireflection structure may have a pyramid shape in which a surface constituting the front surface and/or the back surface of the semiconductor substrate 122 is configured as a (111) surface of the semiconductor substrate 122 and has an irregular size. Therefore, when surface roughness is relatively large, reflectivity of light may be lowered. In the drawings, it is exemplified that an antireflection effect is maximized by forming the uneven or antireflection structure on the front surface and the back surface of the semiconductor substrate 122, respectively. However, the present disclosure is not limited thereto, and the uneven or antireflection structure may be formed on at least one of the front surface and the back surface, or the uneven or antireflection structure may not be provided on both the front surface and the back surface.

In this embodiment, the semiconductor substrate 122 may include a base region having a first or second conductivity type by being doped with a first- or second-conductivity-type dopant having doping concentration lower than that of the first semiconductor layer 124 or the second semiconductor layer 126. That is, the semiconductor substrate 122 may include only the base region without a doping region formed by additionally doping the base region with a dopant.

In this embodiment, the first semiconductor layer 124 located on one side (a front surface as an example) of the semiconductor substrate 122 may be a semiconductor layer including the first-conductivity-type dopant and having the first conductivity type. Then, the second semiconductor layer 126 located on the other side (a back surface as an example) of the semiconductor substrate 122 may be a semiconductor layer including the second-conductivity-type dopant and having the second conductivity type.

As an example, in the first-conductivity-type dopant and the second-conductivity-type dopant, a Group-III element such as boron (B), aluminum (Al), gallium (Ga), or indium (In) may be used as a p-type dopant, and a Group-V element such as phosphorus (P), arsenic (As), bismuth (Bi), or antimony (Sb) may be used as an n-type dopant. The first-conductivity-type dopant or the second-conductivity-type dopant of the semiconductor substrate 122 and the first-conductivity-type dopant or the second-conductivity-type dopant of the first semiconductor layer 124 or the second semiconductor layer 126 may be the same material as or different materials from each other.

Roles of the first semiconductor layer 124 and the second semiconductor layer 126 and materials, roles, and the like of the first transport layers 114 and the second transport layer 116 included in the first photoelectric conversion portion 110 may be changed according to the conductivity types of the semiconductor substrate 122, the first semiconductor layer 124, and the second semiconductor layer 126. This will be described in more detail after the first photoelectric conversion portion 110, the first electrode 42, and the second electrode 44 are described.

Then, a first intermediate film 124a may be provided between the front surface of the semiconductor substrate 122 and the first semiconductor layer 124, and a second intermediate film 126a may be provided between the back surface of the semiconductor substrate 122 and the second semiconductor layer 126. Therefore, a carrier movement path can be simplified by simplifying the structure, and the present disclosure is not limited thereto. Various modifications are possible.

The first intermediate film 124a and the second intermediate film 126a may act as a barrier to electrons and holes so as not to allow minority carriers to pass, and after accumulation in a portion adjacent to the first intermediate film 124a and the second intermediate film 126a, only majority carriers with energy above a predetermined amount pass through the first intermediate film 124a and the second intermediate film 126a. As an example, the first intermediate film 124a and the second intermediate film 126a may be a tunneling film. In this case, the majority carriers with energy above the predetermined amount can easily pass through the first intermediate film 124a and the second intermediate film 126a due to a tunneling effect.

The first intermediate film 124a and the second intermediate film 126a may include various materials that allow carriers to tunnel, and as an example, may include nitrides, semiconductors, conductive polymers, and the like. For example, the first intermediate film 124a and the second intermediate film 126a may include a silicon oxide, a silicon nitride, a silicon oxynitride, an intrinsic amorphous semiconductor (intrinsic amorphous silicon as an example), an intrinsic polycrystalline semiconductor (intrinsic polysilicon as an example), and the like. In this case, the first intermediate film 124a and the second intermediate film 126a may include an intrinsic amorphous semiconductor. As an example, the first intermediate film 124a and the second intermediate film 126a may be formed as an amorphous silicon (a-Si) layer, an amorphous silicon carbide (a-SiC$_x$) layer, an amorphous silicon oxide (a-SiO$_x$) layer, or the like. Then, since the first intermediate film 124a and the second intermediate film 126a have similar properties to the semiconductor substrate 122, surface properties of the semiconductor substrate 122 can be more effectively improved.

In this case, the first intermediate film 124a and the second intermediate film 126a may be integrally formed on the front surface and the back surface of the semiconductor substrate 122, respectively. Therefore, the front surface and the back surface of the semiconductor substrate 122 can be integrally passivated, and can be easily formed without additional patterning. Thicknesses of the first intermediate film 124a and the second intermediate film 126a may be less than those of the conductive regions 124 and 126 (below 5 nm as an example) to sufficiently achieve the tunneling effect. However, the present disclosure is not limited thereto, and the first intermediate film 124a and the second intermediate film 126a may have a variety of materials, shapes, thicknesses, and the like.

In this embodiment, the first semiconductor layer 124 and the second semiconductor layer 126 and/or the first intermediate film 124a and the second intermediate film 126a may be integrally formed on the front surface and the back surface of the semiconductor substrate 122, respectively. Therefore, the first semiconductor layer 124 and the second semiconductor layer 126 and/or the first intermediate film 124a and the second intermediate film 126a may be formed to a sufficient area without additional patterning. However, the present disclosure is not limited thereto.

In this embodiment, the first semiconductor layer 124 and the second semiconductor layer 126 may be formed as a same semiconductor layer as the substrate 122 and have a same crystal structure, but may be formed as semiconductor layers formed separately from the semiconductor substrate 122 or the base region. That is, the crystal structure of the first semiconductor layer 124 and the second semiconductor layer 126 may be different from or the same as the crystal structure of the semiconductor substrate 122.

In addition, the first semiconductor layer 124 may have a same crystal structure as the semiconductor substrate 122, and conversely, the second semiconductor layer 126 may have a different crystal structure from the semiconductor substrate 122.

The junction layer (tunneling junction layer) 130 is located on one side (the front surface as an example) of the second photoelectric conversion portion 120 or the first semiconductor layer 124, so as to electrically connect the second photoelectric conversion portion 120 with the first photoelectric conversion portion 110 thereabove. Although a case where the junction layer 130 is formed as a single layer in contact with the first semiconductor layer 124 of the second photoelectric conversion portion 120 and the second transport layer 116 of the first photoelectric conversion portion 110 is shown in FIG. 1, the present disclosure is not limited thereto.

The junction layer 130 may have a thin thickness, as an example, a thickness smaller than that of the first electrode layer 420 of the first electrode 42, so that tunneling of the carriers may occur smoothly.

The junction layer 130 may electrically connect the first photoelectric conversion portion 110 with the second photoelectric conversion portion 120, and may include a material through which light (long-wavelength light as an example) used in the first photoelectric conversion portion 110 can be transmitted. As an example, the junction layer 130 may include a transparent conductive material (transparent conductive oxide as an example) (TCO). As an example, the junction layer 130 may be formed of at least one of a tin doped indium oxide (ITO), a tungsten-doped indium oxide (IWO), a cesium-doped indium oxide (ICO), and a fluorine doped tin oxide (FTO).

In addition, the junction layer 130 may include at least one of a conductive carbon material, a conductive polymer, n-type or p-type amorphous silicon, and the like. Alternatively, the junction layer 130 enables light (short-wavelength light as an example) used in the second photoelectric conversion portion 120 to be reflected by the second photoelectric conversion portion 120 and light (long-wavelength light as an example) used in the first photoelectric conversion portion 110 to be transmitted and provided to the first photoelectric conversion portion 110.

The junction layer 130 may be formed to have an area smaller than that of the second photoelectric conversion portion 120, and an area of the first photoelectric conversion portion 110 formed thereabove may be formed to have an area the same as or smaller than that of the junction layer 130, but the present disclosure is not limited thereto.

In a case where the junction layer 130 as described above is formed of a transparent conductive material (TCO), the TCO may have a hydrophilic surface property, but a surface thereof, that is, the front surface in contact with the first photoelectric conversion portion 110, includes a surface treatment surface 134 to have a hydrophobic property.

Therefore, two surfaces of the junction layer 130 have surface properties different from each other.

That is, a back surface 132 of the junction layer 130 in contact with the second photoelectric conversion portion 120 is hydrophilic, and a front surface 134 of the junction layer 130 in contact with the first photoelectric conversion portion 110 is hydrophobic.

As described above, in a case where the surface 134 abutting against the first photoelectric conversion portion 110 is hydrophobic, the first photoelectric conversion portion 110 formed later may be formed by a dry method.

The first photoelectric conversion portion 110 including the photoelectric conversion layer 112 including the perovskite compound may be positioned on the junction layer 130. For example, the first photoelectric conversion portion 110 may include the photoelectric conversion layer 112, a first transport layer (first carrier transport layer) (114) on the other side opposite to one side of the photoelectric conversion layer 112 adjacent to the second photoelectric conversion portion 120 and between the photoelectric conversion layer 112 and the first electrode 42, and a second transport layer (second carrier transport layer) 116 on the side of the photoelectric conversion layer 112 adjacent to the second photoelectric conversion portion 120 and between the junction layer 130 and the photoelectric conversion layer 112.

For example, the photoelectric conversion layer 112 may be formed by a perovskite compound having a perovskite structure, and may be a photoactive layer that can be excited by light to form carriers (electrons and holes). As an example, the perovskite structure may have a chemical formula of $AMX_3$ (herein, A is a monovalent organic ammonium cation or metal cation; M is a divalent metal cation; X means a halogen anion). This photoelectric conversion layer 112 serves as $AMX_3$, which may include $CH_3NH_3PbI_3$, $CH_3NH_3PbI_xCl_{(3-x)}$, $CH_3NH_3PbI_xBr_{(3-x)}$, $CH_3NH_3PbCl_xBr_{(3-x)}$, $HC(NH_2)_2PbI_3$, $HC(NH_2)_2PbI_xCl_{(3-x)}$, $HC(NH_2)_2PbI_xBr_{(3-x)}$, $HC(NH_2)_2PbCl_xBr_{(3-x)}$, and the like, or may include a compound in which A of $AMX_3$ is partially doped with Cs. However, the present disclosure is not limited thereto, and a variety of materials may be used as the photoelectric conversion layer 112.

The second transport layer 116 on the other side (the back surface as an example) of the photoelectric conversion layer 112 and between the junction layer 130 and the photoelectric conversion layer 112 is a layer that extracts and transports a second carrier according to a bandgap relationship with the photoelectric conversion layer 112, and the first transport layer 114 located on one side (the front surface as an example) of the photoelectric conversion layer 112 and between the photoelectric conversion layer 112 and the first electrode 42 is a layer that extracts and transports a first carrier according to a bandgap relationship with the photoelectric conversion layer 112. Herein, the first carrier refers to a carrier moving towards the first semiconductor layer 124 according to the first conductivity type of the first semiconductor layer 124, which is a majority carrier for the first conductivity type. When the first semiconductor layer 124 is n-type, the first carrier is an electron, and when the first semiconductor layer 124 is p-type, the first carrier is a hole. Then, the second carrier refers to a carrier moving towards the second semiconductor layer 126 according to the second conductivity type of the second semiconductor layer 126, which is a majority carrier for the second conductivity type. When the second semiconductor layer 126 is p-type, the second carrier is a hole, and when the second semiconductor layer 126 is n-type, the second carrier is an electron.

In the first transport layer 114 and the second transport layer 116, the layer that transports the electrons may be referred to as an electron transport layer, and the layer that transports the holes may be referred to as an HTL. For example, when the second transport layer 116 is an HTL, the HTL may include a spirobifluorene compound (such as 2,2',7,7'-tetrakis(N,N-di-p-methoxyphenylamine)-9,9'-spirobifluorene (spiro-OMeTAD)), 2,2',7,7'-tetrakis(N,N-diphenylamino)-2,7-diamino-9,9-spirobifluorene (spiro-TAD), 2,2',7,7'-tetra(N,N-di-p-tolyl)amino-9,9-spirobifluorene (Spiro-TTB), or N-propyl bromide (NPB)), poly-triarylamine (PTAA), or a metal compound (such as a molybdenum oxide).

In this case, since the front surface 134 of the junction layer 130 is hydrophobic, there is a hydrophobic material. As an example, spiro-TTB and NPB may be applied as the HTL of the second transport layer 116. Therefore, surface properties of the junction layer 130 and the second transport layer 116 are kept the same, thereby improving hole mobility, improving bonding properties, and increasing an FF. The increase in the properties as described above can lead to improved drive performance of tandem cells.

Then, the electron transport layer may include fullerene ($C_{60}$) or derivatives thereof (such as phenyl-$C_{61}$-butyric acid methyl ester (PCBM)). However, the present disclosure is not limited thereto, and may include various materials that can perform a role of transporting the first carrier or the second carrier through the first transport layer 114 and the second transport layer 116, or the electron transport layer and the HTL.

A case where the second transport layer 116, the photoelectric conversion layer 112, and the first transport layer 114 are in contact with each other to minimize the carrier movement path is exemplified in FIG. 1. However, the present disclosure is not limited thereto, and a variety of modifications are possible.

The first electrode 42 may be located on the photoelectric conversion portion 10 (as an example, the first transport layer 114 on the front surface of the first photoelectric conversion portion 110), and the second electrode 44 may be located on the photoelectric conversion portion 10 (as an example, the second semiconductor layer 126 on the back surface of the second photoelectric conversion portion 120).

In this embodiment, the first electrode 42 may include a first electrode layer 420 and a second electrode layer 422 sequentially stacked on one side (the front surface as an example) of the photoelectric conversion portion 10.

Herein, the first electrode layer 420 may be integrally formed on the photoelectric conversion portion 10 (as an example, the first transport layer 114 on the front surface of the first photoelectric conversion portion 110). As an example, the first electrode layer 420 may be in contact with the photoelectric conversion portion 10 (as an example, the first transport layer 114 on the front surface of the first photoelectric conversion portion 110) and be integrally formed thereon. In this specification, "integrally formed" may include not only a case where the entirety of the photoelectric conversion portion 10 is covered without a free space or free region, but also a case where some parts are not formed inevitably. As described above, when the first electrode layer 420 is integrally formed on the first photoelectric conversion portion 110, the first carrier can easily reach the second electrode layer 422 through the first electrode layer 420, thereby reducing resistance in a horizontal direction.

As described above, since the first electrode layer 420 is integrally formed on the first photoelectric conversion portion 110, the first electrode layer 420 may comprise a material that can transmit light (a light-transmitting material). That is, the first electrode layer 420 is composed of a transparent conductive material to allow the carriers to move easily while enabling transmission of the light. Therefore, even if the first electrode layer 420 is integrally formed on the photoelectric conversion portion 10, the transmission of the light is not blocked. As an example, the first electrode layer 420 may include a transparent conductive material (for example, a TCO, a metal-doped indium oxide or a carbon nano tube (CNT) as an example) and the like. As the metal-doped indium oxide, an ITO, an IWO, an ICO, and the like may be listed. However, the present disclosure is not limited thereto, and the first electrode layer 420 may include a variety of other materials.

Then, the second electrode layer 422 may be formed on the first electrode layer 420. As an example, the second electrode layer 422 may be formed in contact with the first electrode layer 422. The second electrode layer 422 may comprise a material having superior electrical conductivity than that of the first electrode layer 420. Therefore, properties such as carrier collection efficiency and resistance reduction according to the second electrode layer 422 can be further improved. As an example, the second electrode layer 422 may comprise an opaque metal having excellent electrical conductivity, or a metal having lower transparency than the first electrode layer 420.

As described above, the second electrode layer 422 is opaque or has low transparency and can hinder incidence of light, and thus may have a predetermined pattern to minimize a shading loss. Therefore, light can be incident on a portion where the second electrode layer 422 is not formed.

For example, the second electrode layer 422 may include a plurality of finger electrodes 42a spaced apart from each other while respectively having a predetermined pitch. Although it is illustrated in FIG. 2 that the finger electrodes 42a is parallel to each other and parallel to a main edge of the photoelectric conversion portion 10 (the semiconductor substrate 122 as an example), the present disclosure is not limited thereto. Then, the second electrode layer 422 may include busbar electrodes 42b formed in a direction intersecting the finger electrodes 42a and connected to the finger electrodes 42a. Only one busbar electrode 42b may be provided, or a plurality of busbar electrodes 42b may be provided while having a pitch larger than that of the finger electrodes 42a as shown in FIG. 2. In this case, a width of the busbar electrode 422 may be greater than that of the finger electrode 422a, but the present disclosure is not limited thereto. Therefore, the width of the busbar electrode 422 may be equal to or less than that of the finger electrode 422a. However, the present disclosure is not limited thereto, and the second electrode layer 422 may have a variety of planar shapes.

In this embodiment, the second electrode 44 may have a different stacked structure from the first electrode 42. This is in consideration of the material of the first photoelectric conversion portion 110 and the crystal structure of the second semiconductor layer 126 included in the second photoelectric conversion portion 120.

For example, in this embodiment, the second electrode 44 may include a metal electrode layer 442 located on the other side (the front surface as an example) of the photoelectric conversion portion 10. As an example, the second electrode 44 may be configured as a single layer of the metal electrode layer 442 in contact with the photoelectric conversion portion 10 (for example, the second semiconductor layer 126), and may not be provided with a TCO layer or the like.

The metal electrode layer 442 of the second electrode 44 may comprise a material having superior electrical conductivity than that of the first electrode layer 420 of the first electrode 42. As an example, the metal electrode layer 442 of the second electrode 44 may comprise an opaque metal having excellent electrical conductivity, or a metal having lower transparency than the first electrode layer 420 of the first electrode 42. As described above, the metal electrode layer 442 may be partially formed on the photoelectric conversion portion 10 to have a predetermined pattern. Accordingly, in a bi-facial structure, light may be incident to a portion where the metal electrode layer 442 is not formed.

For example, the metal electrode layer 442 may include a plurality of finger electrodes spaced apart from each other while respectively having a predetermined pitch, and may further include busbar electrodes formed in a direction intersecting the finger electrodes and connected to the finger electrodes. Except that the metal electrode layer 442 is located on the other side of the photoelectric conversion portion 10, the description of the finger electrode 42a and the busbar electrode 42b included in the second electrode layer 422 of the first electrode 42 may be applied to the finger electrode and the busbar electrode of the metal electrode layer 442. In this case, widths, pitches, and the like of the finger electrode 42 and the busbar electrode 42 b of the first electrode 42 may have a same value as or different values from those of the finger electrode and the busbar electrode of the second electrode 44. In addition, the second electrode layer 422 of the first electrode 42 and the metal electrode layer 442 of the second electrode 44 may have same or different materials, compositions, shapes, or thicknesses.

In this embodiment, the metal electrode layer 442 including an opaque metal or a metal has a predetermined pattern in the first electrode 42 and the second electrode 44 of the solar cell 100, and thus, has a bi-facial structure in which light may be incident to the front surface and the back surface of the photoelectric conversion portions 110 and 120. Accordingly, an increase in an amount of light used in the solar cell 100 may help to improve efficiency of the solar cell 100.

In the above description, it is exemplified that the second electrode layer 422 of the first electrode 42 and the metal electrode layer 442 of the second electrode 44 have a same or similar planar shape while each having a pattern. However, the second electrode layer 422 of the first electrode 42 and the metal electrode layer 442 of the second electrode 44 may have different planar shapes. As an example, when the solar cell 100 has a monofacial structure in which no light is incident to the back surface, the second electrode 44 or the metal electrode layer 442 may be integrally formed on (formed in contact with) the photoelectric conversion portion 10 (for example, the second electrode layer 126). As described above, the shapes, the arrangement, and the like of the second electrode layer 422 of the first electrode 42 and the metal electrode layer 442 of the second electrode 44 may be variously modified.

In this embodiment, the second electrode layer 422 or the metal electrode layer 442 may include a printed layer including a metal and a resin. Herein, the second electrode layer 422 is formed in contact with the first electrode layer 420 and no insulating film is provided on the surface of the second semiconductor layer 126 on which the metal electrode layer 442 is positioned, so a fire-through penetrating through the insulating film and the like is not required. Accordingly, in this embodiment, a printed layer may be formed using a low-temperature firing paste including only a metal and a resin (a binder, a curing agent, and an additive) without including a glass frit composed of a predetermined metal compound (as an example, an oxygen-containing oxide, a carbon-containing carbide, or a sulfur-containing sulfide) and the like.

For example, the printed layer may be formed by applying the low-temperature firing paste including the metal and the resin without the glass frit and heat-treating the low-temperature firing paste to cure the low-temperature firing paste. Accordingly, the printed layer included in the second electrode layer 422 or the metal electrode layer 442 may have conductivity without causing a plurality of metal particles to be sintered, be in contact with each other, and be aggregated. As an example, by curing the low-temperature firing paste at a lower temperature (e.g., below 150° C.) than the temperature used in an existing low-temperature process, in the printed layer included in the second electrode layer 422 or the metal electrode layer 442, the plurality of metal particles may not be completely necked and may have a shape in which the plurality of metal particles are connected while being in contact with each other.

As described above, when the second electrode layer 422 or the metal electrode layer 442 includes the printed layer formed using the low-temperature firing paste, the second electrode layer 422 or the metal electrode layer 442 may be formed by a simple process, and a deterioration phenomenon in the first photoelectric conversion portion 110 including the perovskite compound from occurring in the process of forming the second electrode layer 422 or the metal electrode layer 442 may be prevented. However, the present disclosure is not limited thereto. The second electrode layer 422 or the metal electrode layer 442 may further include an additional metal layer or the like in addition to the printed layer, and the second electrode layer 422 or the metal electrode layer 442 may not include the printed layer, but may include a plating layer, a sputtering layer, and the like. Various other modifications are possible.

The second electrode layer 422 or the metal electrode layer 442 may include various metals. For example, the second electrode layer 422 or the metal electrode layer 442 may include various metals such as silver, copper, gold, and aluminum. In this embodiment, the second electrode layer 422 and the metal electrode layer 442 may have same materials, structures, shapes, thicknesses, and the like, as each other or may have different materials, structures, shapes, thickness, and the like, from each other. As an example, the width of the second electrode layer 422 may be smaller than that of the metal electrode layer 442 and/or the thickness of the second electrode layer 422 may be greater than that of the metal electrode layer 442. This is to reduce a shading loss due to a second electrode layer 422 positioned on the front surface and sufficiently ensure specific resistance, but the present disclosure is not limited thereto.

As described above, the photoelectric conversion portion 10 according to this embodiment may have a tandem structure in which the second photoelectric conversion portion 120 based on a single semiconductor material (silicon as an example) and the first photoelectric conversion portion 110 based on the perovskite compound are bonded by the junction layer 130. In this case, the first photoelectric conversion portion 110 has a larger bandgap than the second photoelectric conversion portion 120. That is, the first photoelectric conversion portion 110 has a relatively large bandgap and absorbs a short wavelength that is relatively small to use the short wavelength to cause photoelectric conversion, and the second photoelectric conversion portion 120 has a lower bandgap than the first photoelectric conversion portion 110 and effectively absorbs a long wavelength that is a wavelength larger than that of the light used in the first photoelectric conversion portion 110 to use the long wavelength to cause the photoelectric conversion.

In more detail, when light is incident through the front surface of the solar cell 100, the first photoelectric conversion portion 110 absorbs the short wavelength to generate electrons and holes by the photoelectric conversion. In this case, the first carrier moves to the first electrode 42 side and is collected, and the second carrier passes through the first photoelectric conversion portion 110 and the second photoelectric conversion portion 120, moves to the second electrode 44 side, and is collected. When the long wavelength not used in but passing through the first photoelectric conversion portion 110 reaches the second photoelectric conversion portion 120, the second photoelectric conversion portion 120 absorbs the long wavelength and generates the first carrier and the second carrier by the photoelectric conversion. In this case, the first carrier passes through the first photoelectric conversion portion 110, moves to the first electrode 42 side, and is collected, and the second carrier moves to the second electrode 44 side and is collected.

As described above, the first electrode 42 adjacent to the first photoelectric conversion portion 110 and the second electrode 44 adjacent to the second photoelectric conversion portion 120 may have different stacked structures.

The first semiconductor layer 124 located on the front surface of the semiconductor substrate 122 may include an amorphous portion (an amorphous layer as an example) doped with a first-conductivity-type dopant. For example, in this embodiment, the first semiconductor layer 124 may be doped with the first-conductivity-type dopant and formed of amorphous silicon.

For example, the first semiconductor layer 124 may include an amorphous silicon layer doped with the first-conductivity-type dopant.

As an example, when the first semiconductor layer 124 includes an amorphous silicon layer, a difference in properties with the semiconductor substrate 122 may be minimized by including a same semiconductor material as the semiconductor substrate 122.

Then, the second semiconductor layer 126 located on the back surface of the semiconductor substrate 122 may include an amorphous portion (a polycrystalline layer as an example) doped with a second-conductivity-type dopant. For example, in this embodiment, the second semiconductor layer 126 may include a polycrystalline portion doped with the second-conductivity-type dopant and hydrogenated (i.e., a polycrystalline portion containing hydrogen). To this end, as an example, a hydrogen injection process in which hydrogen is injected into the second semiconductor layer 126 may be performed in order to improve a passivation property of the second semiconductor layer 126.

Herein, "including a polycrystalline portion" may mean including a case where a polycrystalline structure is included as a whole, and also including a case where a volume ratio of a portion having a polycrystalline structure is greater than that of a portion having an amorphous structure. As an example, in this embodiment, the second semiconductor layer 126 may comprise a polycrystalline semiconductor layer having the polycrystalline structure as a whole, and thus, may have excellent photoelectric conversion efficiency and excellent electrical properties.

For example, the second semiconductor layer 126 may include a polycrystalline silicon layer doped with the second-conductivity-type dopant and containing hydrogen. Herein, the polycrystalline silicon layer may mean having a polycrystalline portion containing silicon as a main material. As an example, the second semiconductor layer 126 may comprise an amorphous silicon layer doped with the second-conductivity-type dopant, containing hydrogen, and having a polycrystalline structure as a whole.

As described above, the second semiconductor layer 126, when composed of the polycrystalline portion, may have high carrier mobility, and thus, may have excellent photoelectric conversion efficiency and excellent electrical properties.

Accordingly, the semiconductor substrate 122, the second semiconductor layer 126, and/or the second intermediate film 126a include a same semiconductor material (silicon as an example), and may have an insulation-junction structure or a tunnel-junction structure in which the semiconductor substrate 122 and the second semiconductor layer 126 and/or the second intermediate film 126a are bonded using the second intermediate film 126a (i.e., the insulating film) composed of an insulating material therebetween. In this case, since the thickness of the second intermediate film 126a is thin, the movement of the carriers may not be hindered.

In this embodiment, the second semiconductor layer 126 located on the back surface of the semiconductor substrate 122 may comprise a polycrystalline portion absorbing a relatively large amount of light, and the first semiconductor layer 124 located on the front surface of the semiconductor substrate 122 may comprise an amorphous portion absorbing less light than the second semiconductor layer 126. Accordingly, unwanted light absorption on the front surface of the semiconductor substrate 122 may be minimized. Then, in the second semiconductor layer 126 located on the back surface of the semiconductor substrate 122, carrier movement properties, electrical connection properties, and the like can be effectively improved.

Then, the first semiconductor layer 124 positioned adjacent to the first photoelectric conversion portion 110 may comprise the amorphous portion, thereby improving matchability with the first photoelectric conversion 110 including the perovskite compound to improve the carrier movement properties.

The first semiconductor layer 124 may directly contact the first photoelectric conversion portion 110 with the junction layer 130 interposed therebetween. That is, the junction layer 130 may be positioned to be in contact with the first semiconductor layer 124, and the first photoelectric conversion portion 110 may be positioned to be in contact with the junction layer 130. Then, the structure may be simplified, and the carrier may move smoothly.

Then, the second semiconductor layer 126 positioned on a side opposite to a side on which the first photoelectric conversion portion 110 is positioned on the semiconductor substrate 122 may include a polycrystalline portion to effectively improve the carrier movement properties, the electrical connection properties, and the like.

In this case, the thickness of the second semiconductor layer 126 may be equal to or greater than that of the first semiconductor layer 124. As an example, the thickness of the second semiconductor layer 126 may be greater than that of the first semiconductor layer 124. This is because the second semiconductor layer 126 is positioned on the back surface of the semiconductor substrate 122, thereby hindering incident light to a lesser extent even with a relatively large thickness. Alternatively, the thickness of the first semiconductor layer 124 may be 10 nm or less (5 nm to 10 nm as an example), and the thickness of the second semiconductor layer 126 may be above 10 nm (greater than 10 nm and 500 nm or less as an example). These thicknesses consider the properties of the first semiconductor layer 124 and the second semiconductor layer 126, the amount of light passing therethrough, and the like, but the present disclosure is not limited thereto.

In addition, as described above, the junction layer 130 may be divided into a back surface 132 in contact with the first semiconductor layer 124 and a front surface 134 in contact with the second transport layer 116.

The division as described above schematically shows that the surface properties of the front surface 134 and the back surface 132 are different for the single-layer junction layer 130 formed of a same material.

That is, the back surface 132 includes a hydrophilic surface which has a property of the transparent conductive material (TCO) constituting the single junction layer 130, and the front surface 134 changes the surface property to a surface that is hydrophobic to the TCO by surface treatment and has another surface property.

As mentioned above, roles, materials, and the like of the first semiconductor layer 124, the second semiconductor layer 126, the first transport layers 114, and the second transport layer 116 may be changed according to the conductivity types of the semiconductor substrate 122, the first semiconductor layer 124, and the second semiconductor layer 126. In consideration of this, the structure of the solar cell 100 according to an example of this embodiment will be described with reference to FIG. 3, and the carrier movement properties thereof will be described with reference to FIG. 4.

Figure 3:
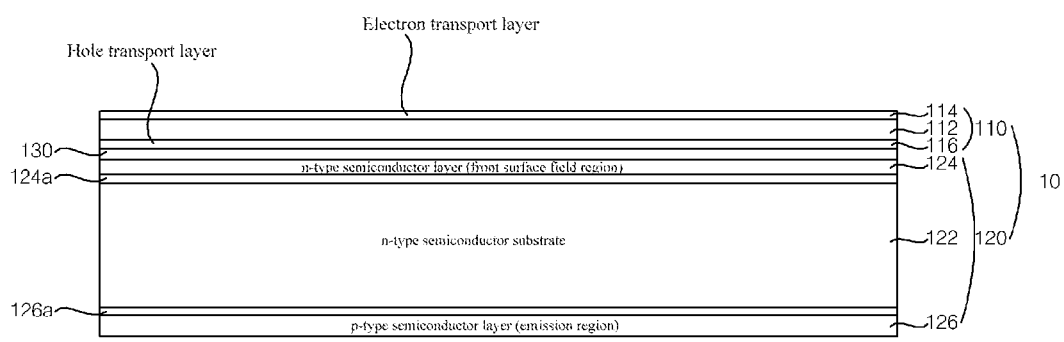
FIG. 3 is a diagram simulatively showing an example of conductivity types and roles of a plurality of layers included in a photoelectric conversion portion of the solar cell according to some embodiments of the present disclosure.

FIG. 3 is a diagram simulatively showing an example of conductivity types and roles of a plurality of layers included in a photoelectric conversion portion 10 of a solar cell 100 according to some embodiments of the present disclosure. For clear understanding, FIG. 3 does not specifically illustrate an uneven or antireflection structure and the like, but mainly illustrates a stacking order, conductivity types, and roles of the plurality of layers included in the photoelectric conversion portion 10.

Referring to FIG. 3, in this example, the semiconductor substrate 122 may have an n type. When the semiconductor substrate 122 has an n type, bulk properties are excellent and a life time of carriers may be improved.

Then, in this embodiment, the first semiconductor layer 124 may have an n type which is a conductivity type the same as that of the semiconductor substrate 122, but may have higher doping concentration than the semiconductor substrate 122, and the second semiconductor layer 126 may have a p type which is a conductivity type different from that of the semiconductor substrate 122. Accordingly, the second semiconductor layer 126 located on the back surface of the semiconductor substrate 122 may constitute an emission region forming a pn junction with the semiconductor substrate 122, and the first semiconductor layer 124 located on the front surface may constitute a front electric field region in which front surface field is formed to prevent recombinations. Then, since the emission region directly involved in the photoelectric conversion is located on the back surface, the emission region may be formed with a sufficient thickness (to be thicker than the front electric field region as an example), thereby improving photoelectric conversion efficiency. Then, a light loss may be minimized by thinly forming the first semiconductor layer 124 serving as the front electric field region.

In this case, in the first photoelectric conversion portion 110 located on the second photoelectric conversion portion 120, a first transport layer 114 located at an upper part may be configured as an electron transport layer that transports electrons, and a second transport layer 116 located at a lower part may be configured as an HTL that transports holes. In this case, the first photoelectric conversion portion 110 may have an excellent effect.

In this solar cell 100, when light is incident through the front surface of the solar cell 100, the first photoelectric conversion portion 110 absorbs the short wavelength to generate electrons and holes by the photoelectric conversion. In this case, the electrons move to the first electrode 42 side through the first transport layer 114 and are collected, and the holes pass through the first photoelectric conversion portion 116 and the second photoelectric conversion portion 120, move to the second electrode 44 side, and are collected. When the long wavelength not used in but passing through the first photoelectric conversion portion 110 reaches the second photoelectric conversion portion 120, the second photoelectric conversion portion 120 absorbs the long wavelength and generates electrons and holes by the photoelectric conversion. In this case, the electrons pass through the first semiconductor layer 124 and the first photoelectric conversion portion 110, move to the first electrode 42 side, and are collected, and the holes move to the second electrode 44 side through the second semiconductor layer 126 and are collected.

Figure 4:
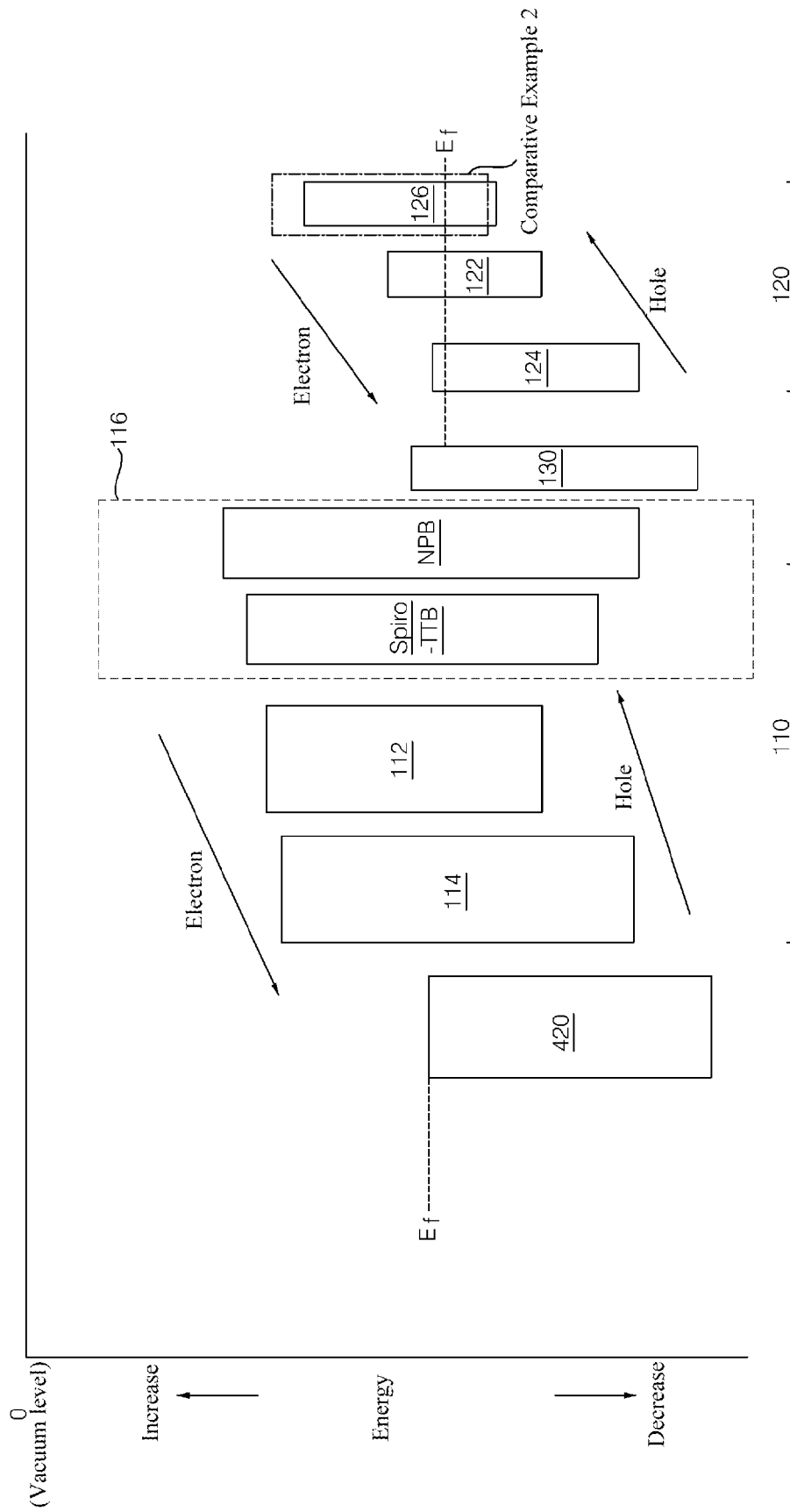
FIG. 4 is an energy band diagram schematically showing energy bands of photoelectric conversion portions of the solar cell shown in FIG. 3 and a solar cell according to Comparative Example 1.

FIG. 4 is an energy band diagram schematically showing energy bands of the solar cell shown in FIG. 3 and a solar cell according to Comparative Example 1. In FIG. 4, the illustration of the first intermediate film, the second intermediate film, the second electrode layer of the first electrode, and the second electrode are omitted.

Referring to FIG. 4, in this example, the energy band diagram in which holes and electrons smoothly move in the first photoelectric conversion portion 110 and the second photoelectric conversion portion 120 is provided. That is, in each of the first photoelectric conversion portion 110 and the second photoelectric conversion portion 120, energy of a conduction band has a tendency to gradually decrease in a direction of flow of the electrons, and energy of a valence band has a tendency to gradually increase in the direction of flow of the electrons. That is, since the first semiconductor layer 124 includes an amorphous portion having a low energy bandgap (1.5 to 1.7 eV) to form an energy band diagram in which carriers may flow smoothly, the carrier movement properties are very excellent.

In addition, when a transparent conductive material (TCO) is applied as the junction layer 130, the surface property of the front surface 134 bonded to the second transport layer 116 through plasma surface treatment is changed from hydrophilic to hydrophobic, so a hydrophobic material such as NPB, Spiro-TTB, TAD, or the like may be applied as the second transport layer 116.

In this case, NPB has hydrophobicity with a measurement angle of about 68° to 70°, and Spiro-TTB has hydrophobicity with a measurement angle of about 83° to 87°.

While the energy band gap is satisfied to satisfy the flow of the carriers, a material that meets the surface property may also be applied as the second transport layer 116 serving as an HTL.

FIG. 4 illustrates the structure of the solar cell 100 shown in FIG. 3 as an example. Even when the conductivity types of the semiconductor substrate 122, and the first semiconductor layer 124, and the second semiconductor layer 126 are different, the tendency of the energy band diagram may also have a tendency to improve the carrier movement properties.

As described above, according to this embodiment, the surface property of the junction layer 130 may be changed to improve matchability with the first photoelectric conversion 110 formed above and including the perovskite compound, thereby improving the carrier movement properties. Then, the second semiconductor layer 126 may be formed as a polycrystalline portion having excellent carrier mobility to improve the carrier movement properties, and can reduce a material cost of the second electrode 44 and simplify a manufacturing process. Therefore, efficiency and productivity of the solar cell 100 having a tandem structure can be improved.

A manufacturing method for the solar cell 100 having the above structure is described in detail with reference to FIG. 5 to FIG. 12b. A detailed description of the content already described above will be omitted, and content not described will be described in detail.

Figure 5:
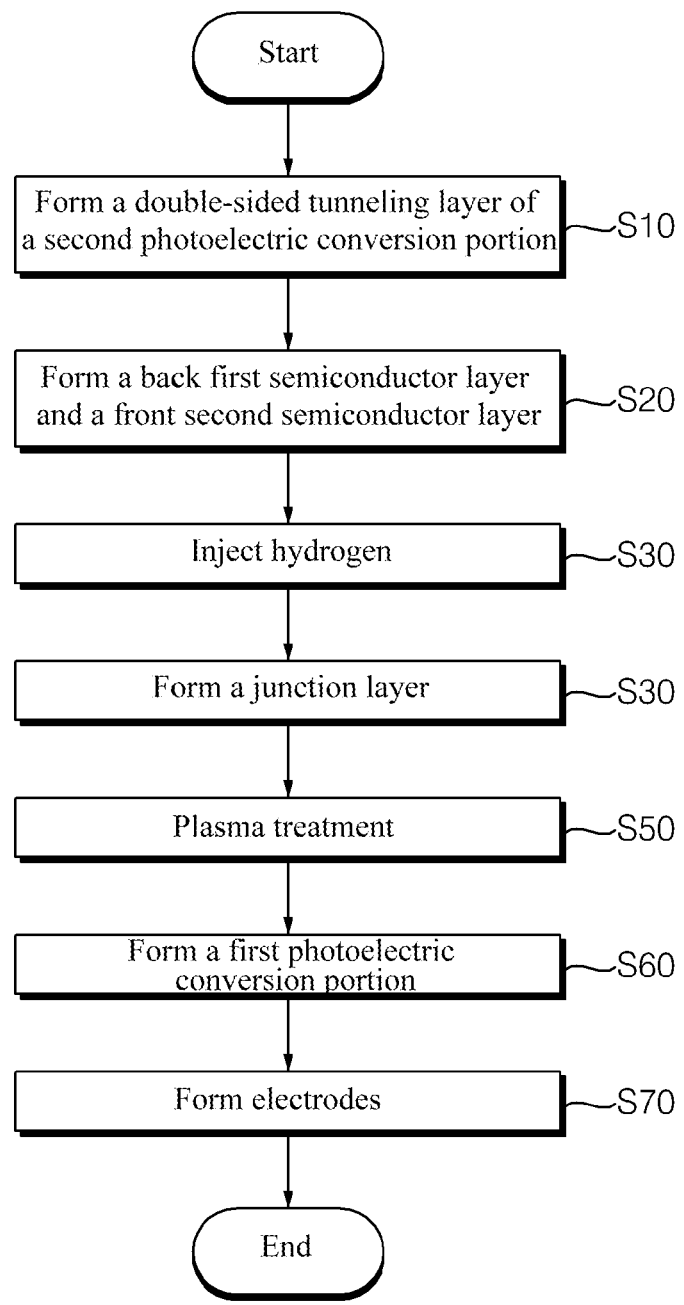
FIG. 5 is a flowchart of a solar cell manufacturing method according to some embodiments of the present disclosure.
Figure 6:
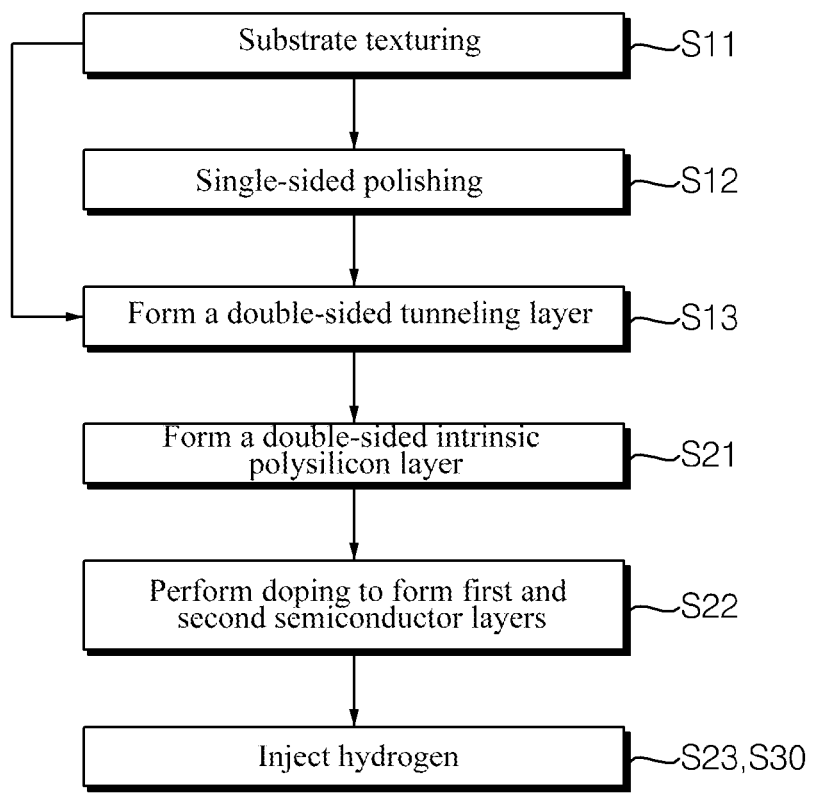
FIG. 6 is a detailed sequence diagram till formation of a doping layer in FIG. 5.
Figure 7A:
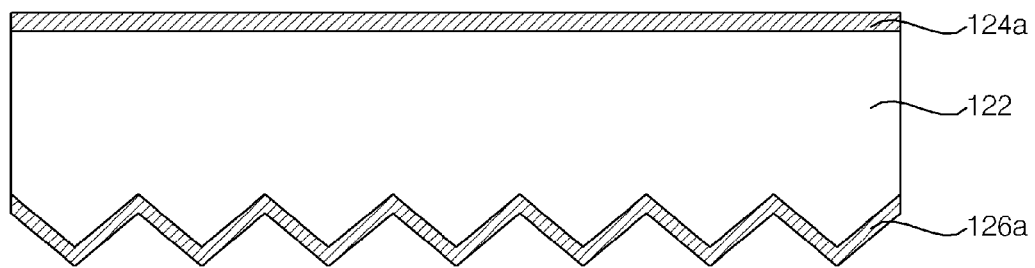
FIG. 7a and FIG. 7b are sectional views for describing the manufacturing method in FIG. 6.
Figure 7B:
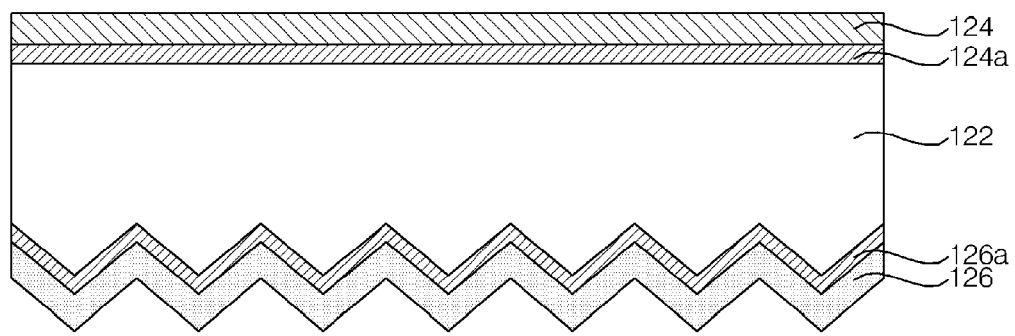
Figure 8:
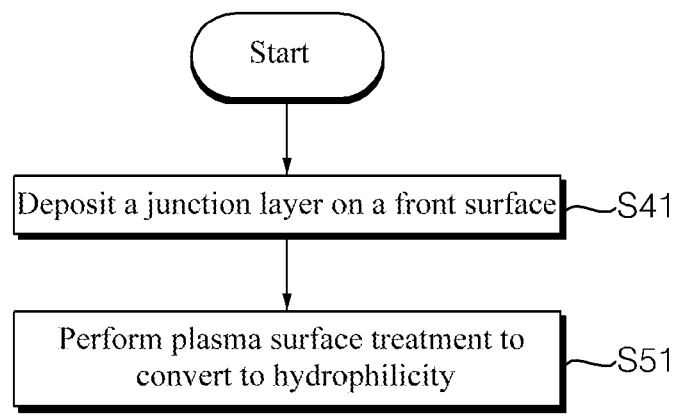
FIG. 8 is a detailed sequence diagram till formation of a junction layer in FIG. 5.
Figure 9:
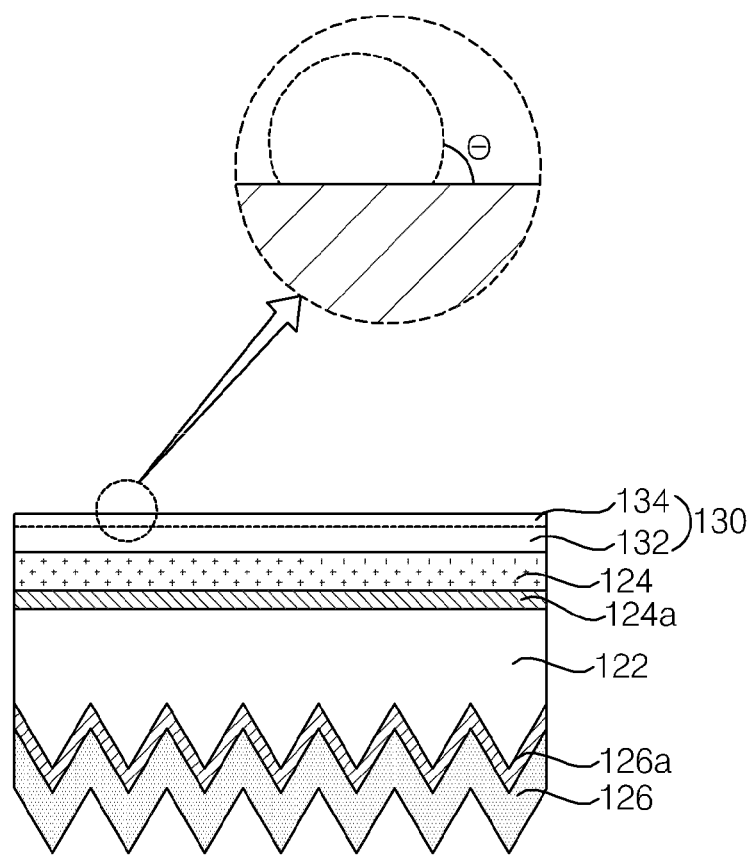
FIG. 9 is a sectional view showing the manufacturing method in FIG. 8.
Figure 10:
FIG. 10 shows contact angles representing changes in a surface property of the junction layer in FIG. 8.
Figure 10:
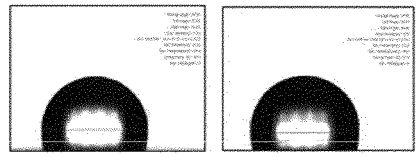
Figure 10:
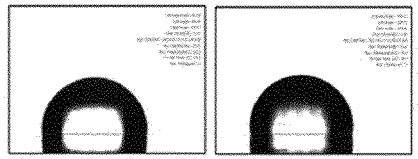
Figure 10:
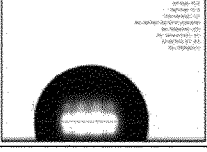
Figure 11:
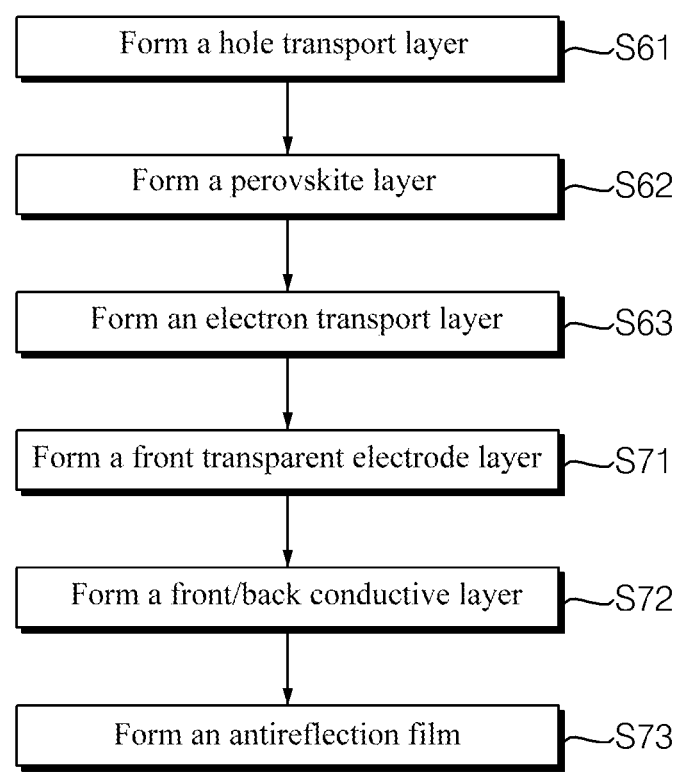
FIG. 11 is a detailed sequence diagram of formation of a first photoelectric conversion portion and electrodes in FIG. 5.
Figure 12A:
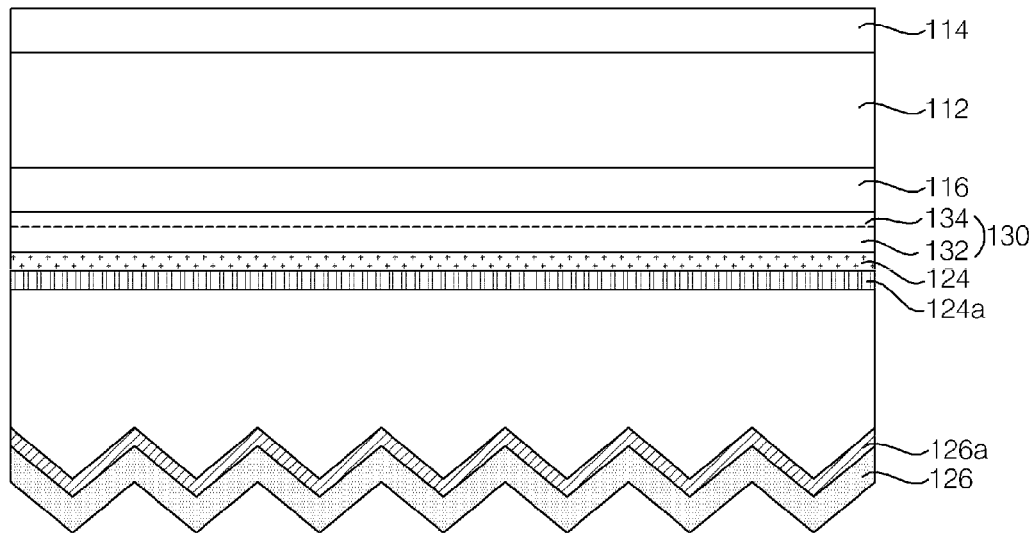
FIG. 12a to FIG. 12b are sectional views of the manufacturing method in FIG. 11.
Figure 12B:
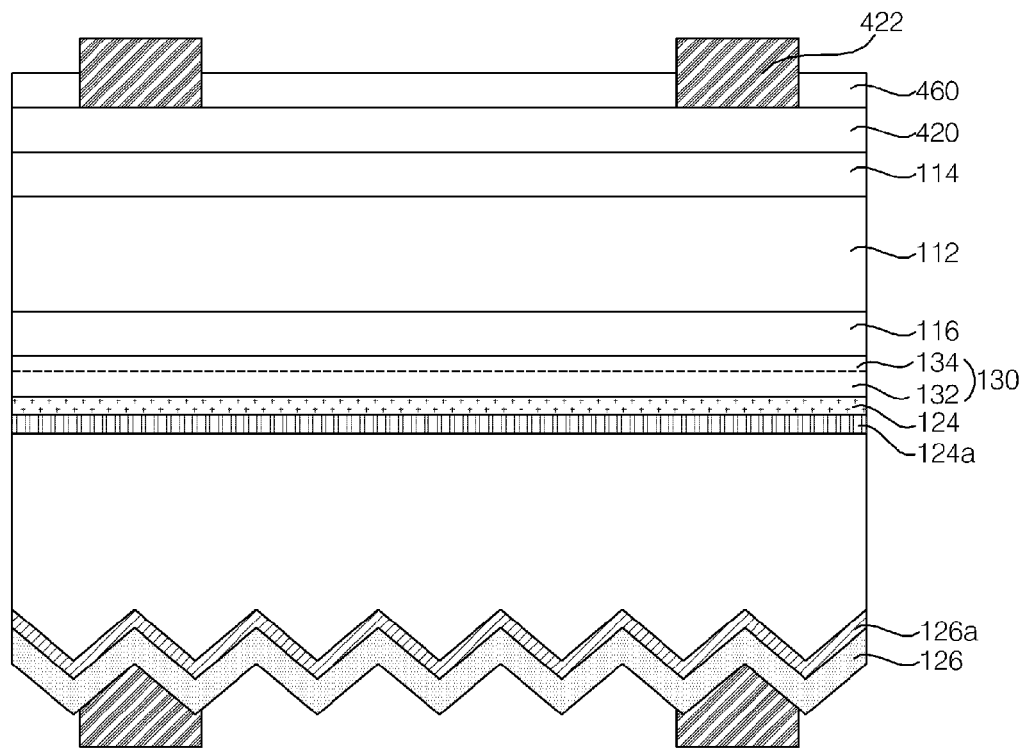

FIG. 5 is a flowchart of a solar cell manufacturing method according to some embodiments of the present disclosure, FIG. 6 is a detailed sequence diagram till formation of a doping layer in FIG. 5, FIG. 7a and FIG. 7b are sectional views for describing the manufacturing method in FIG. 6, FIG. 8 is a detailed sequence diagram till formation of a junction layer in FIG. 5, FIG. 9 is a sectional view showing the manufacturing method in FIG. 8, FIG. 10 shows contact angles representing changes in a surface property of the junction layer in FIG. 8, FIG. 11 is a detailed sequence diagram of formation of a first photoelectric conversion portion and electrodes in FIG. 5, and FIG. 12a to FIG. 12b are sectional views of the manufacturing method in FIG. 11.

Referring to FIG. 5, the manufacturing method for the solar cell 100 according to this embodiment includes a step of forming a double-sided tunneling layer of a second photoelectric conversion portion (S10), a step of forming a first semiconductor layer and a second semiconductor layer (S20), a hydrogen injection step (S30), a junction layer formation step (S40), a plasma treatment step (S50), a first photoelectric conversion portion formation step (S60), and an electrode formation step (S70).

Referring to FIG. 6, the step of forming a doping layer (S20) may include 6 steps.

For example, first, a semiconductor substrate 122 including a base region having a first-conductivity-type dopant or a second-conductivity-type dopant is manufactured. In this case, at least one of the front surface and the back surface of the semiconductor substrate 122 may be textured to have unevenness to have an antireflection structure (S11). Wet or dry texturing may be used for the texturing of the surface of the semiconductor substrate 122. The wet texturing may be performed by immersing the semiconductor substrate 122 in a texturing solution, and double-sided texturing may be performed by immersion in a TMAH or KOH solution.

In addition, as shown in FIG. 7a, in the case of texturing only on the back surface, an additional front-surface polishing process may be performed (S12). A back-surface polishing process may be performed by immersing only one surface in an etching solution, or in an acid solution of HF or $HNO_3$, to which both transfer and floating are applicable. In addition, the semiconductor substrate 122 may be textured by reactive ion etching (RIE) or the like. As described above, in the present disclosure, the semiconductor substrate 122 may be textured with various methods.

Next, as shown in FIG. 7a, a second intermediate film 126a and a first intermediate film 124a are formed on two sides of the semiconductor substrate 122 (S13).

As an example, the second intermediate film 126a and the first intermediate film 124a as described above may be formed by thermal oxidation, deposition (e.g., chemical vapor deposition (CVD) or atomic layer deposition (ALD)), or the like. For example, double-sided washing may be performed after the polishing, and the two surfaces of the washed semiconductor substrate may be oxidized by applying $DIO_3$ and $H_2O_2$ by using a wet method, and thermal oxidation in a furnace or UVO may be performed by using a dry method. As described above, generated silicon oxide films may be used as the second intermediate film 126a on the back surface of the semiconductor substrate 122, and as the first intermediate film 124a on the front surface.

The silicon oxide films formed on the front surface and the back surface are formed to have a thickness thinner than 2 nm so that tunneling can be performed.

Subsequently, as shown in FIG. 7b, intrinsic polysilicon layers 124b and 126b are formed on two sides (S21).

As described above, after the intrinsic polysilicon layers 124b and 126b are formed on the front surface and the back surface of the semiconductor substrate 122 and then selectively integrally formed on side surfaces, the intrinsic polysilicon layers 124b and 126b formed on the side surfaces of the semiconductor substrate 122 may be removed, and the intrinsic polysilicon layers 124b and 126b are formed only on the front surface and the back surface of the semiconductor substrate 122.

For example, the intrinsic polysilicon layers 124b and 126b may be formed by thermal oxidation, deposition (e.g., CVD or ALD), or the like. For example, the intrinsic polysilicon layers 124b and 126b may be formed by thermal oxidation, deposition (e.g., CVD), low-pressure chemical vapor deposition (LPCVD) as an example), or the like. In this embodiment, the intrinsic polysilicon layers 124b and 126b may be formed as a polycrystalline portion composed of a semiconductor material not including a dopant. The intrinsic polysilicon layers 124b and 126b may be formed with a thickness of less than 100 nm by LPCVD in a $SiH_4$ gas atmosphere at a temperature of less than 600° C.

Then, a doping layer (not shown) is formed on the intrinsic polysilicon layer 126b on the back surface (S22).

The doping layer may be formed by atmospheric pressure chemical vapor deposition or plasma enhanced chemical vapor deposition (APCVD or PECVD), and when the second semiconductor layer 126 is formed on the back surface of the semiconductor substrate 122, boron silicate glass (BSG) or undoped silicate glass (USG) may be deposited as a dopant source if the second semiconductor layer 126 is p-type. In this case, during the deposition in the gas atmosphere of SiH4, O2, B2H2, and H2, the thickness of the doping layer is formed to satisfy a range from 80 nm to 150 nm.

In addition, a front doping layer (not shown) is formed on the front surface of the semiconductor substrate 122. In this case, when the first conductivity type is n-type, the front doping layer may form phosphosilicate glass (PSG).

Accordingly, PSG is formed as a doping layer on the front surface of the semiconductor substrate 122, and BSG/USG is formed, on the back surface, as a doping layer in which a second-type dopant is retained.

Subsequently, heat treatment is performed to perform doping to the respective lower intrinsic polysilicon layers 124b and 126b (S22).

For example, a first semiconductor layer 124 and a second semiconductor layer 126 are formed by activation as shown in FIG. 7b.

For example, when heat treatment is performed at a temperature of 900° C. or higher in a gas atmosphere of POCl3 in a furnace device, the intrinsic polysilicon layers 124b and 126b formed on the front surface and the back surface of the substrate 122 are doped and recrystallized by dopant diffusion from respective doping layers stacked above.

Therefore, a second dopant is diffused on the back surface to form a semiconductor layer having a polycrystalline structure of the second semiconductor layer 126, and a first dopant is diffused on the front surface to form the first semiconductor layer 124.

In this case, when the first semiconductor layer 124 is formed in a same layer as the semiconductor substrate 122 by doping, the first semiconductor layer 124 may also be formed while having an amorphous crystal structure similarly to the semiconductor substrate 122.

Subsequently, the first semiconductor layer 124 may be exposed to the front surface of the substrate 122 and the second semiconductor layer 126 may be exposed to the back surface of the substrate 122 by completely removing the doping layers remaining above and below the semiconductor substrate 122.

The washing and removal of the doping layer as described above may be performed by etching according to DHF, but are not limited thereto.

Then, hydrogen injection is performed on the two sides of the semiconductor substrate 122 (S30).

In the hydrogen injection step, hydrogen is injected into the first semiconductor layer 124 and the second semiconductor layer 126. As described above, since the first semiconductor layer 124 and the second semiconductor layer 126 are formed at a high temperature of 900° ° C. or higher or 600 to 800° C., even if hydrogen is included in the first semiconductor layer 124 and the second semiconductor layer 126, dehydrogenation at a high temperature is also possible. Regarding this, the hydrogen injection step is performed after the formation of the first semiconductor layer 124 and the second semiconductor layer 126, thereby increasing hydrogen content to sufficiently perform hydrogen passivation.

As an example, a hydrogen injection layer (not shown) containing hydrogen may be formed on the first semiconductor layer 124 and the second semiconductor layer 126 of the semiconductor substrate 122, and heat treatment is performed at a temperature higher than normal temperature (400 to 600° C. as an example) to inject hydrogen.

Herein, an insulating layer that may contain high content of hydrogen, such as a silicon nitride layer containing hydrogen or an aluminum oxide layer containing hydrogen, may be used as the hydrogen injection layer. The hydrogen injection layer is removed after the hydrogen injection step.

However, the present disclosure is not limited thereto, and the hydrogen injection layer may alternatively remain and be used as a rear passivation film, a reflective film, an antireflection film, or the like. Various other methods are possible.

Then, the hydrogen injection method in the hydrogen injection step is not limited to the above methods. For example, heat treatment may alternatively be performed at a temperature higher than normal temperature (400 to 600° C. as an example) in a mixed gas atmosphere mixed with a hydrogen gas and a carrier gas (such as argon (Ar) and nitrogen ($N_2$)) to inject hydrogen. In addition, hydrogen may alternatively be injected by using hydrogen plasma or the like.

As described above, when hydrogen injection into the first semiconductor layer 124 and the second semiconductor layer 126 is completed, as shown in FIG. 8, a junction layer 130 is formed on the first semiconductor layer 124 (S41 and S40).

For example, the junction layer 130 may be formed on at least one part of the first semiconductor layer 124 of the second photoelectric conversion portion 120. As an example, the junction layer 130 may be formed by a sputtering process. The sputtering process may be performed at a low temperature, and as a single-sided process, the junction layer 130 may be formed only on the first semiconductor layer 124. However, the present disclosure is not limited thereto, and various methods such as a coating method are applicable.

The junction layer 130 may be formed to have an area equal to that of the second photoelectric conversion portion 120, or may be formed to have a smaller area than the second photoelectric conversion portion 120 in some other embodiments.

This may be formed only in a central region in the sputtering process to expose an edge region of the second photoelectric conversion portion 120 after a mask (not shown) is placed, but is not limited thereto, which may be formed with a variety of methods.

In this case, the junction layer 130 formed may have a thin thickness to allow smooth tunneling of carriers, and may have a thinner thickness than the first electrode layer 420 of the first electrode 42.

The junction layer 130 may electrically connect the first photoelectric conversion portion 110 with the second photoelectric conversion portion 120, and may include a material through which light (long-wavelength light as an example) used in the first photoelectric conversion portion 110 can be transmitted. The junction layer 130 may be formed of a transparent conductive material (transparent conductive oxide as an example) (TCO). As an example, the junction layer 130 may be formed of at least one of an ITO, an IWO, an ICO, and an FTO.

In addition, the junction layer 130 enables light (short-wavelength light as an example) used in the second photoelectric conversion portion 120 to be reflected by the second photoelectric conversion portion 120 and light (long-wavelength light as an example) used in the first photoelectric conversion portion 110 to be transmitted and provided to the first photoelectric conversion portion 110.

In a case where the junction layer 130 as described above is formed of a transparent conductive material (TCO), the transparent conductive material has a hydrophilic surface property. Therefore, the junction layer 130 has a property of a small contact angle.

Subsequently, surface treatment is performed on a front surface 134 (that is, a surface in contact with the first photoelectric conversion portion 110) of the formed junction layer 130 to change the surface property from hydrophilic to hydrophobic (S51 and S50).

For example, as shown in FIG. 9, by plasma treatment, the front surface 134 with a surface modified to have a hydrophobic state is formed.

For the plasma treatment as described above, the substrate 122 is placed in a plasma device of PVD, PECVD, PEALD, or the like and plasma surface treatment is performed in a gas atmosphere of $CH_4$, $CH_4/H_2$, or $CH_4/N_2$.

As an example, as shown in Table 1 below, plasma surface treatment may be performed to be in contact with a process condition.

TABLE 1

| Process condition | Temperature ° C. | $CH_4$ (sccm) | $H_2$ (sccm) | $N_2$ (sccm) | Pressure (Torr) | Gap (mm) | Radio-frequency power (w) | Power density (Kw/cm$^2$) | Time (S) | Instance |
|---|---|---|---|---|---|---|---|---|---|---|
| $CH_4$ | 100 | 250 | 0 | 0 | 1.0 | 20 | 100 | 62.5 | 60 | 1 |
| $CH_4/H_2$ | 100 | 250 | 250 | 0 | 1.5 | 20 | 100 | 62.5 | 60 | 2 |
| $CH_4/H_2$ | 50 | 5000 | 300 | 0 | 1.0 | 40 | 800 | 320 | 30 | 3 |
| $CH_4/N_2$ | 50 | 5000 | 0 | 300 | 1.0 | 40 | 800 | 320 | 30 | 4 |

That is, plasma treatment may be performed under a variety of process conditions in the plasma device, and as shown in the 4 experimental examples in Table 1, the process time is more than 1 second in the device whose power density is within 60 to 70, and the process time is within 30 seconds in the device with power density between 300 and 350. However, in various devices, the process temperature also satisfies a range within 200° C., for example, below 150° C. and within 40° C. to 120° C., thereby preventing deterioration of amorphous silicon applied to a substrate. As described above, as shown in Table 1, treated plasma treatment contains $CH_4$, and may be treated in another gas atmosphere with addition of $H_2$ and $N_2$, which, as shown in FIG. 10, changes to have a similar hydrophobic surface property depending on an effect thereof.

Referring to FIG. 10, the ICO is applied as the junction layer 130 prior to the plasma treatment, and a contact angle of a surface thereof is about 68.3°.

In this case, through $CH_4$ plasma treatment as shown in Experimental Examples 1 to 4, the surface of the surface-treated ICO allows the contact angle to remain hydrophobic above 90°.

In this case, each contact angle is measured according to an ASTM D5936 standard.

As described above, the hydrophilic surface of the ICO may be changed to hydrophobic by the $CH_4$ plasma treatment, and there are two surfaces with different properties from each other as shown in FIG. 9.

That is, a back surface 132 of the junction layer 130 in contact with the second photoelectric conversion portion 120 is hydrophilic, and a front surface 134 of the junction layer 130 in contact with the first photoelectric conversion portion 110 is hydrophobic.

In addition, although it is described in the present disclosure that the $CH_4$ plasma treatment is performed, in some other embodiments, fluorine plasma treatment may be performed.

In the case of the fluorine plasma treatment, plasma treatment is performed in a fluorine atmosphere such as $CF_4$, $SF_6$, or $NF_3$ in a same plasma device.

Surface modification from a hydrophilic surface to a hydrophobic surface may also be performed by the fluorine plasma treatment as described above. In the fluorine plasma treatment, the process temperature may also be kept below 150° C.

Subsequently, the first photoelectric conversion portion 110 including the photoelectric conversion layer 112 including the perovskite compound is formed on the hydrophobic front surface 134 of the junction layer 130 after the surface treatment as described above.

That is, as shown in FIG. 11 and FIG. 12, a tandem solar cell 100 is formed by forming the first photoelectric conversion portion 110 and electrodes (S60 and S70 in FIG. 5).

In the step of forming the first photoelectric conversion portion 110 (S60), as shown in FIG. 12*a*, the first photoelectric conversion portion 110 is formed on the junction layer 130. For example, a second transport layer 116, a photoelectric conversion layer 112, and a first transport layer 114 may be sequentially formed on the junction layer 130 (S61, S62, and S63).

The second transport layer 116, the photoelectric conversion layer 112, and the first transport layer 114 may be formed with various methods. In particular, the second transport layer 116 may be performed by a dry process without a wet process.

As an example, the second transport layer 116 is deposited (e.g., a dry method such as physical deposition, chemical deposition, or plasma deposition) to deposit hydrophobic Spiro-TTB or NPB on the front surface of the hydrophobic junction layer.

As described above, since the second transport layer 116 formed by deposition is hydrophobic, an energy difference between the hydrophobic front surface 134 of the junction layer 130 and a surface thereof is very small, allowing for a uniform and thin substrate without shedding.

As described above, in the case of deposition in a state where a difference in surface energy is very small, current leakage is reduced between the second transport layer and the junction layer, and hole transport proceeds smoothly, so as to increase an open voltage and an FF, thereby improving overall efficiency of the tandem solar cell 100.

The photoelectric conversion layer 112 and the first transport layer 114 may be formed on the second transport layer 116 with various methods.

That is, although the photoelectric conversion layer 112 and the first transport layer 114 may be formed by deposition like the second transport layer 116, the photoelectric conversion layer 112 and the first transport layer 114 may be formed by a printing method or the like depending on the properties of the photoelectric conversion layer 112. Herein, the printing method may include inkjet printing, gravure printing, spray coating, doctor blade, bar coating, gravure coating, brush painting, slot-die coating, and the like.

Next, as shown in FIG. 12*b*, in the electrode formation step (S70), a first electrode 42 and a second electrode 44 may be formed.

That is, a first electrode layer 420 of the first electrode 42 may be formed on the first photoelectric conversion portion 110 (e.g., the first transport layer 114) (S71), and a second electrode layer 422 may be formed on the first electrode layer 420 (S72). Then, a metal electrode layer 442 of the second electrode 44 may be formed on the second photoelectric conversion portion 120 (e.g., the second semiconductor layer 126 configured as a polycrystalline portion).

As an example, the first electrode layer 420 of the first electrode 42 may be formed by a vacuum deposition process or a sputtering process. The vacuum deposition process or the sputtering process may be performed at a low temperature, and the first electrode layer 420 of the first electrode 42 may be formed only on the front surface of a single side. However, the present disclosure is not limited thereto, and various methods such as a coating method are applicable.

Then, in this embodiment, the second electrode layer 422 of the first electrode 42 and the metal electrode layer 442 of the second electrode 44 may be formed. As an example, the second electrode layer 422 of the first electrode 42 and the metal electrode layer 442 of the second electrode 44 may be formed by applying a low-temperature firing paste including a metal and a resin and performing curing heat treatment for curing the low-temperature firing paste.

As an example, after the formation of the first electrode layer 420 of the first electrode 42, the low-temperature firing paste for the second electrode layer 422 of the first electrode 42 and the metal electrode layer 442 of the second electrode 44 may be applied and the curing heat treatment for simultaneously curing the low-temperature firing paste for the second electrode layer 422 of the first electrode 42 and the metal electrode layer 442 of the second electrode 44 may be performed. The curing heat treatment may be performed at a low temperature of 150° C. or lower to prevent a change in properties, deterioration, or the like of the first photoelectric conversion portion 110 including the perovskite compound.

The order of the process of forming the first electrode layer 420 of the first electrode 42, the coating process and the heat treatment process of the second electrode layer 422 of the first electrode 42, and the coating process and the heat treatment process of the metal electrode layer 442 of the second electrode 44 may be variously modified.

The above description exemplifies that the second electrode layer 422 of the first electrode 42 and the metal electrode layer 442 of the second electrode 44 are formed by the printing method to simplify the process. However, the present disclosure is not limited thereto, and the method and process conditions of forming the second electrode layer 422 of the first electrode 42 and the metal electrode layer 442 of the second electrode 44 may be variously modified.

According to this embodiment, productivity may be improved by forming a solar cell having a tandem structure with excellent efficiency through a simple manufacturing process. In this case, the deterioration in properties or the like of the first semiconductor layer 124 formed as the amorphous portion or the first photoelectric conversion portion 110 including the perovskite compound may be effectively prevented by maintaining the process temperature of the electrode formation step (S70) or the like performed after the first photoelectric conversion portion forming step (S60) of forming the first photoelectric conversion portion 110 including the perovskite compound at a low temperature (e.g., 150° C. or lower).

In this embodiment, an uneven or antireflection structure by the texturing is provided on the front surface of the semiconductor substrate 122 to perform an antireflection role, so the antireflection film is not provided on the front surface of the solar cell 100. In this case, an uneven or antireflection structure corresponding to the uneven or antireflection structure formed on the front surface of the semiconductor substrate 122 may be formed as it is on the first semiconductor layer 124 located on the front surface of the semiconductor substrate 122, the junction layer 130, the second transport layer 116, the photoelectric conversion layer 112, the first transport layer 114, and two side surfaces of the first electrode layer 420. As described above, since an additional antireflection structure is not provided, the structure can be simplified. However, the present disclosure is not limited thereto, and an antireflection film 460 may be further provided on at least one part of the first electrode layer 420 of the first electrode 42 as illustrated in FIG. 12b. Various other modifications are possible (S73).

Then, in this embodiment, a simple structure is exemplified because an additional passivation film is not provided on the second semiconductor layer 126. This is because the second semiconductor layer 126 may contain hydrogen in a sufficient amount by the hydrogen injection step and have excellent passivation properties, and thus, an effect achieved due to the remaining passivation film may be little. However, the present disclosure is not limited thereto.

Figure 13:
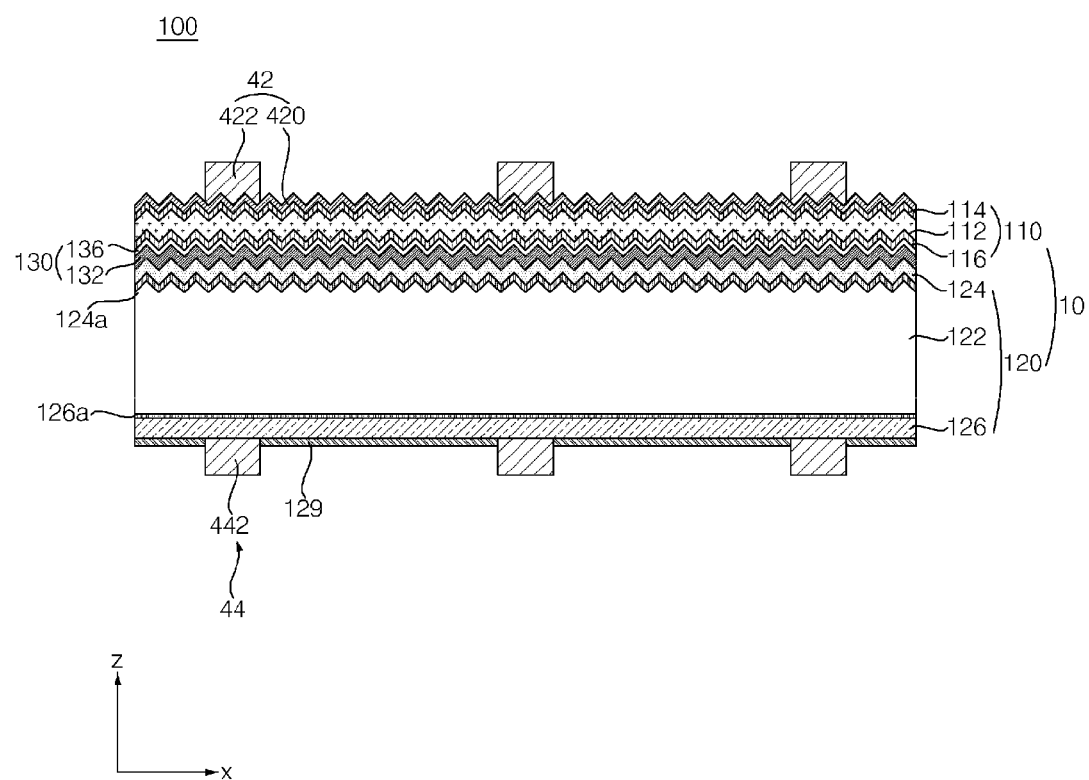
FIG. 13 is a sectional view schematically showing a solar cell according to some other embodiments of the present disclosure.

Some other embodiments of the present disclosure are described below with reference to FIG. 13. FIG. 13 is a sectional view schematically showing a solar cell according to some other embodiments of the present disclosure.

Referring to FIG. 13, a quantum dot solar cell according to another applicable example of the present disclosure may have a tandem structure further including a first photoelectric conversion portion 110 including a photoelectric conversion layer 112 including a perovskite compound and a second photoelectric conversion portion 120 having a different material or structure from the first photoelectric conversion portion 110.

In the solar cell 100 according to this applicable example, the second photoelectric conversion portion 120 may have a pn junction structure including a semiconductor substrate 122. As an example, the second photoelectric conversion portion 120 may include a semiconductor substrate 122, and conductive regions 124 and 126 formed in the semiconductor substrate 122 or on the semiconductor substrate 122. The conductive regions 124 and 126 may include a first conductive region 124 having a first conductivity type and a second conductive region 126 having a second conductivity type.

The semiconductor substrate 122 may comprise a crystalline semiconductor (e.g., a monocrystalline or polycrystalline semiconductor, monocrystalline or polycrystalline silicon as an example) including a single semiconductor material (a Group IV element as an example). Then, based on the semiconductor substrate 122 with high crystallinity and few defects, the second photoelectric conversion portion 120 may have excellent electrical properties. As an example, the second photoelectric conversion portion 120 may have a crystalline silicon solar cell structure.

Since configuration of the semiconductor substrate 122 is the same as that of the semiconductor substrate 122 in FIG. 1, a detailed description thereof is omitted.

The first conductive region 124 having the first conductivity type may be formed on a front surface of the semiconductor substrate 122. In addition, the second conductive region 126 having the second conductivity type opposite to the first conductivity type of the semiconductor substrate 122 may be positioned (contact as an example).

The first conductive region 124 may be a region including a first-conductivity-type dopant and having the first conductivity type. Then, the second conductive region 126 may be a region including a second-conductivity-type dopant and having the second conductivity type.

The first conductive region 124 and the second conductive region 126 may respectively include a same semiconductor material as the semiconductor substrate 122 (in some embodiments, a single semiconductor material, silicon as an example). As an example, the first conductive region 124 and the second conductive region 126 may be formed as an amorphous silicon (a-Si) layer, an amorphous silicon carbide (a-SiC$_x$) layer, an amorphous silicon oxide (a-SiO$_x$) layer, or the like. Then, differences in properties that may occur when the first conductive region 124 and the second conductive region 126 have similar properties to the semiconductor substrate 122 but include semiconductor materials different from each other can be minimized.

For example, each of the first conductive region 124 and the second conductive region 126 may be formed by doping the first-conductivity-type dopant or the second-conductivity-type dopant into an amorphous semiconductor or the like that can be easily manufactured with various methods such as deposition. Then, the first conductive region 124 and the second conductive region 126 may be easily formed through a simple process. In addition, each of the first conductive region 124 and the second conductive region 126 may be manufactured into a nanocrystalline silicon or polysilicon layer with various methods such as deposition, and may be formed by doping the first-conductivity-type dopant or the second-conductivity-type dopant. Then, the first conductive region 124 and the second conductive region 126 may be easily formed through a simple process.

In a case where the first conductive region 124 and the second conductive region 126 have different crystalline properties from the semiconductor substrate 122, tunneling layers 124a and 126a may be additionally included between the substrate 122. Moreover, the description thereof is the same as that in FIG. 1, and thus is omitted.

In this embodiment, when the semiconductor substrate 122 (or the base region) has the first conductivity type, the second conductive region 126 may constitute an emission region forming a pn junction with the semiconductor substrate 122. The first conductive region 124 may constitute a front surface field region in which a front surface field is formed to prevent recombinations. Then, since the emission region directly involved in the photoelectric conversion is located on the back surface, the emission region may be formed with a sufficient thickness (to be thicker than the front electric field region as an example), thereby further improving the photoelectric conversion efficiency. However, the present disclosure is not limited thereto. Therefore, the semiconductor substrate 122 may also have the second conductivity type, so that the first conductive region 124 constitutes an emission region and the second conductive region 126 constitutes a back surface field region.

In this embodiment, the first conductive region 124 and the semiconductor substrate 122 may have an n type, and the second conductive region 126 may have a p type. Then, in the first photoelectric conversion portion 110 located on the second photoelectric conversion portion 120, the first transport layer 114 located at an upper part may transport electrons, and the second transport layer 116 located at a lower part may transport holes. Compared with an opposite case, in this case, the first photoelectric conversion portion 110 may bring an excellent effect. In addition, the semiconductor substrate 122 may have an n type, thereby prolonging a life time of the carriers. However, the present disclosure is not limited thereto, and the semiconductor substrate 122 has either the first conductivity type or the second conductivity type, or has either the n type or the p type, which may be modified in a variety of manners.

A junction layer (tunneling junction layer) 130 is located on a front surface of the second photoelectric conversion portion 140 to connect the second photoelectric conversion portion 120 with the first photoelectric conversion portion 110 located thereabove. Although it is shown in the drawing that the junction layer 130 is in direct contact with the first conductive region 124 and the first photoelectric conversion portion 110 respectively, the present disclosure is not limited thereto. The junction layer 130 may have a thin thickness, as an example, a thickness smaller than the thicknesses of the electrode layers 420 and 440, so that tunneling of the carriers may occur smoothly.

In this case, unlike the solar cell 100 of FIG. 1, the junction layer 130 of FIG. 13 has a plurality of layered structures.

That is, the junction layer 130 also includes an interface layer 136 above a base junction layer 132.

The base junction layer 132 may electrically connect the first photoelectric conversion portion 110 with the second photoelectric conversion portion 120, and may include a material through which light (long-wavelength light as an example) used in the first photoelectric conversion portion 110 can be transmitted. The base junction layer 132 may be formed of a transparent conductive material (transparent conductive oxide as an example) (TCO). As an example, the base junction layer 132 may be formed of at least one of an ITO, an IWO, an ICO, and an FTO.

The junction layer 130 enables light (short-wavelength light as an example) used in the second photoelectric conversion portion 120 to be reflected by the second photoelectric conversion portion 120 and light (long-wavelength light as an example) used in the first photoelectric conversion portion 110 to be transmitted and provided to the first photoelectric conversion portion 110.

In a case where the base junction layer 132 is formed of a transparent conductive material (TCO), the transparent conductive material (TCO) has a hydrophilic surface property. Therefore, the junction layer 130 has a property of a small contact angle.

The interface layer 136 is further formed above the base junction layer 132.

The interface layer 136 is formed above the base junction layer 132, and is formed of a material having a surface property so as to make a junction surface with the first photoelectric conversion portion 110 hydrophobic while causing a similar tunneling effect.

The interface layer 136 as described above may be formed to have a thinner thickness than the tunneling layers 124a and 126a, and may be formed so as not to affect overall electrical properties of the junction layer 130.

The interface layer 136 as described above may be formed by performing high-concentration doping on same amorphous silicon as the semiconductor substrate 122.

Surface properties may be hydrophobic by the high concentration doping of the dopant as described above.

As an example, after an amorphous silicon layer is formed by chemical deposition or the like on the transparent conductive material (TCO) as the base junction layer 132, doping may be performed in a gas atmosphere of $B_2H_6$ or $PH_3$.

The heat treatment of deposition and doping as described above may be performed at a temperature within 100° C.

In addition, in some other embodiments, a hydrophobic resin layer is formed thin and may thus be utilized as the interface layer 136. Polytetrafluoro ethylene (PTFE) may be applied as the hydrophobic resin layer as mentioned above.

The interface layer 136 as described above may be formed to have a thin thickness within 1.5 nm to 2 nm.

Therefore, the front surface of the junction layer 130 (that is, the surface in contact with the first photoelectric conversion portion 110) may be formed to have a hydrophobic surface property while the interface layer 136 is formed to maintain the tunneling effect.

The first photoelectric conversion portion 110 including the perovskite compound is formed on the hydrophobic junction layer 130.

The first photoelectric conversion portion 110 may include a photoelectric conversion layer 112, a second transport layer (second carrier transport layer) 116 on one side of the photoelectric conversion layer 112 and between the junction layer 130 and the photoelectric conversion layer 112, and a first transport layer (first carrier transport layer) 114 on the other side of the photoelectric conversion layer 112 and between the photoelectric conversion layer 112 and the first electrode 42.

In this case, the second transport layer 116 formed may also be applied as applied as spiro-TTB, NPB, or the like with a hydrophobic surface property through a dry process, so as to form a large-area tandem solar cell 100.

Since structures and materials of respective layers of the first photoelectric conversion portion 110 are the same as those in FIG. 1, detailed descriptions thereof will be omitted.

In addition, the first electrode 42 may be located on the first photoelectric conversion portion 110 (the first transport layer 114 on the front surface thereof as an example), and the second electrode 44 may be located on the second photoelectric conversion portion 140 (the second conductive region 126 on the back surface thereof as an example). That is, the solar cell 10 according to this embodiment may have a tandem structure in which the second photoelectric conversion portion 140 based on a single semiconductor material (silicon as an example) is bonded to the first photoelectric conversion portion 110 based on a perovskite compound through the junction layer 130.

Figure 14:
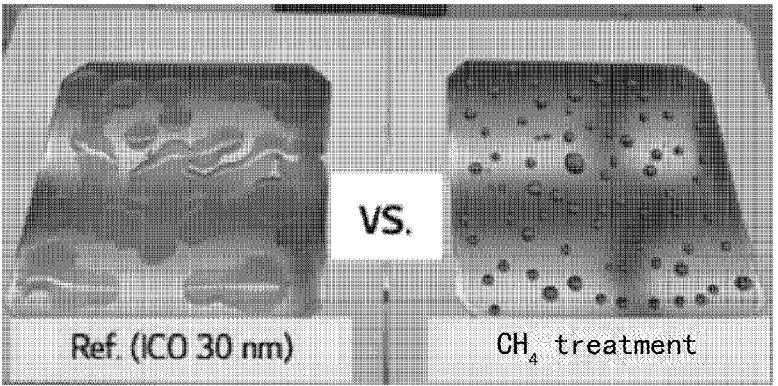
FIG. 14 is a diagram showing changes in a surface property of a junction layer.
Figure 14:
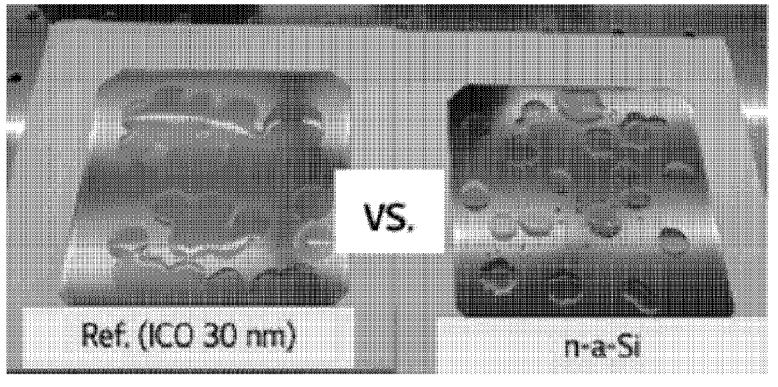
Figure 14:
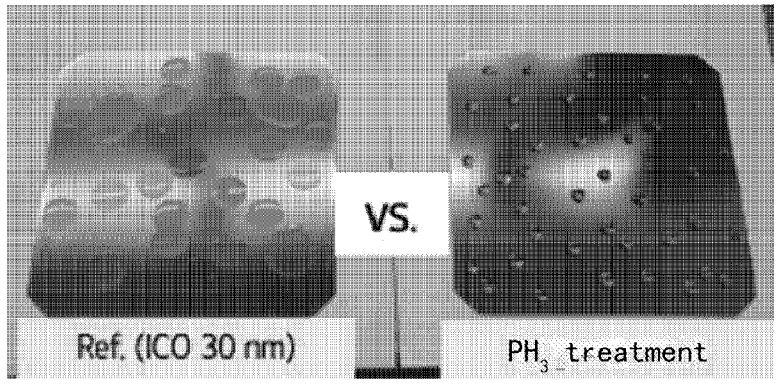

As described above, the formed solar cell according to the present disclosure has the properties as shown in FIG. 14 to FIG. 15.

FIG. 14 is a diagram showing changes in a surface property of a junction layer, and FIG. 15 is a graph showing optical properties changing according to the surface property of the junction layer.

Referring to FIG. 14, it is shown that a transparent conductive material (TCO) applied as the junction layer 130 or the base junction layer 132 is applied to a surface of an ICO substrate, and hydrophilicity can be confirmed with a naked eye through a water drop test.

In this case, when comparative images are checked, a surface change to hydrophobicity can be confirmed by $CH_4$ plasma treatment on an ICO surface, or by an amorphous silicon layer doped with an N-type dopant and including an interface layer 136, or in the case of doping with a $PH_3$ dopant.

In addition, referring to FIG. 15, changes in optical properties according to various substrate treatments are shown.

Figure 15A:
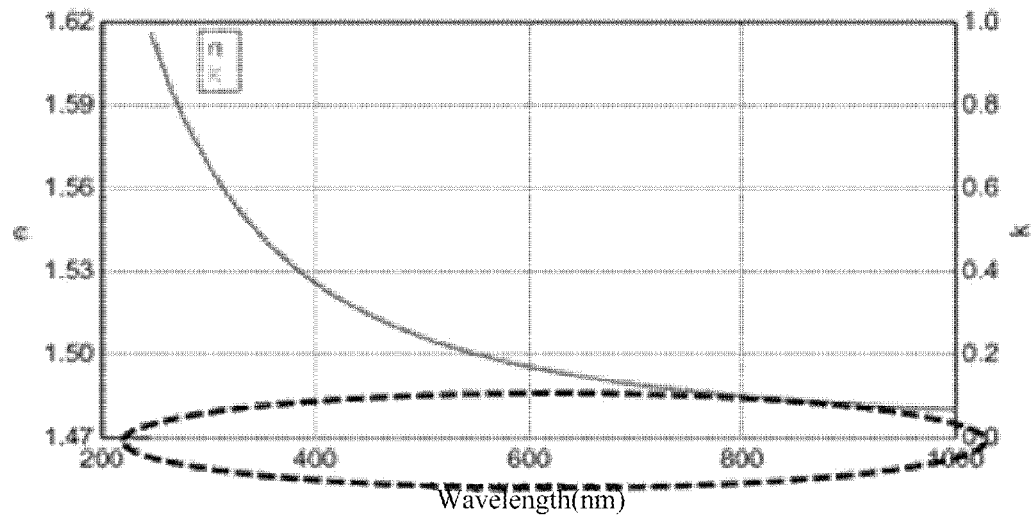
FIG. 15 is a graph showing optical properties changing according to the surface property of the junction layer.

Representatively, as optical properties, a refractive index n and an extinction coefficient k are defined, and optical properties of an ordinary glass substrate are shown in FIG. 15a.

That is, in a wavelength band ranging from 200 nm to 1000 nm that serves as a wavelength band passing through the junction layer 130 of the present disclosure, the refractive index n exhibits a property of decreasing depending on a wavelength, and in the wavelength band, the extinction coefficient k converges almost to 0.

Figure 15B:
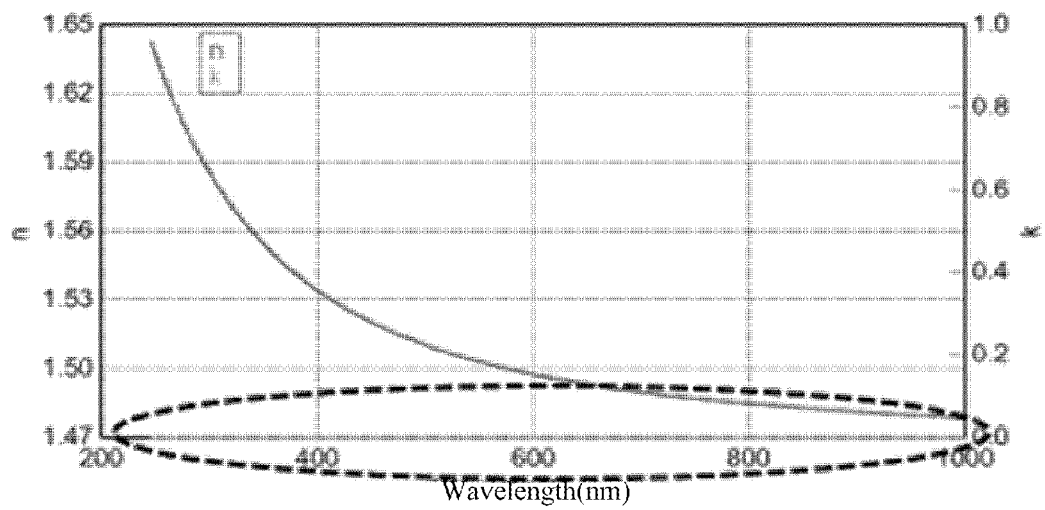
Figure 15C:
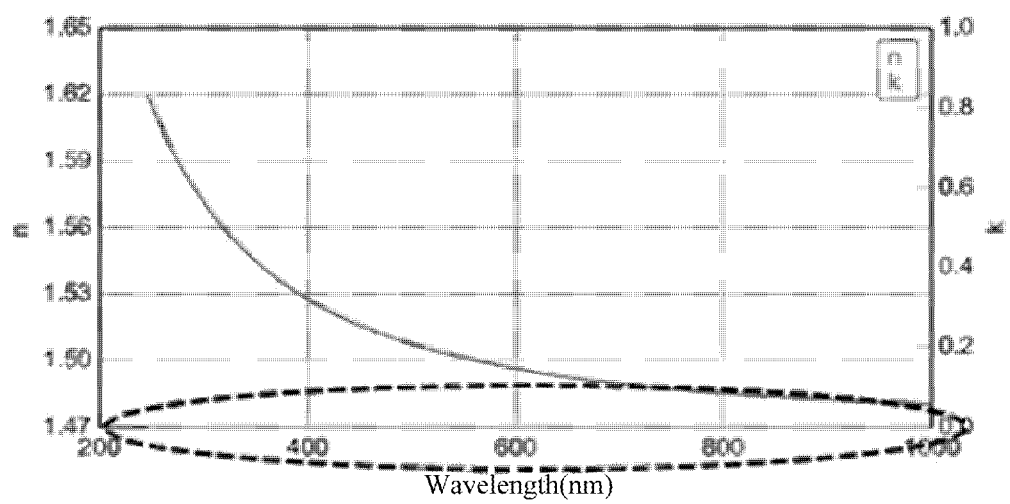
Figure 15D:
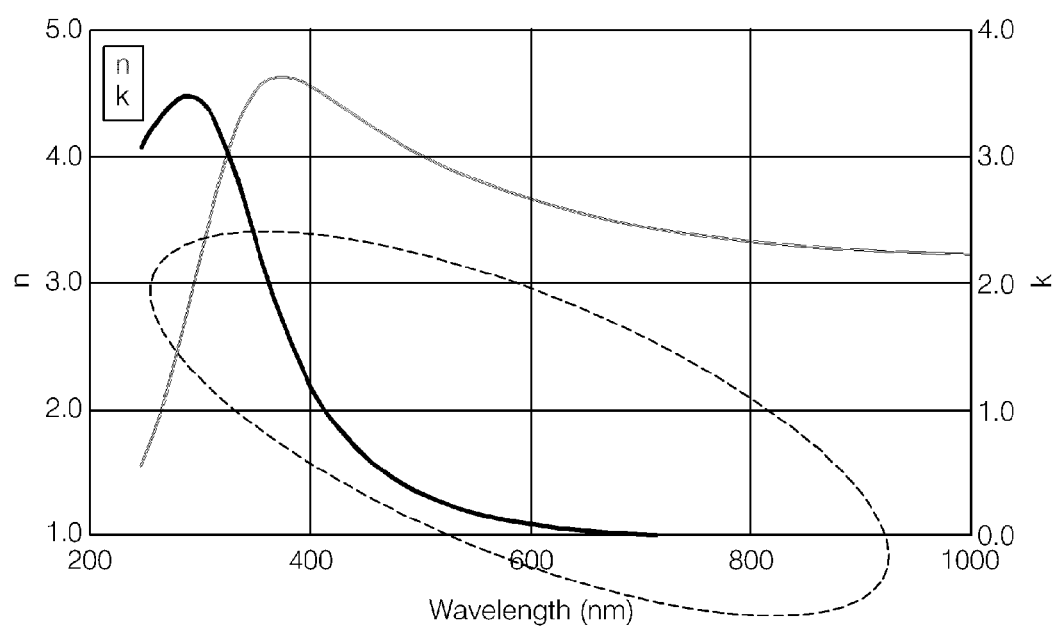

In this case, FIG. 15b analyzes optical properties after $CH_4$ plasma treatment, and FIG. 15c and FIG. 15d analyze optical properties after $PH_3$ doping treatment.

As shown in FIG. 15b, after the plasma treatment, it is observed that the optical properties do not differ from those of the ordinary glass substrate.

In addition, referring to FIG. 15c and FIG. 15d, FIG. 15c shows that optical properties in a low doping state of $PH_3$ are at a same level as those of the ordinary glass substrate. However, there is a tendency that the surface property exhibits a decrease in hydrophobicity at a low concentration of doping.

In this case, as shown in FIG. 15d, in the case of excessive doping with a dopant, when optical properties are compared with those of the ordinary glass substrates, partial differences occur, or the surface property exhibits strong hydrophobicity.

In this case, when FIG. 15d is observed in more detail, within 400 to 800 nm, which is a wavelength band of light required in the junction layer 130 of the present disclosure, there is an extinction coefficient k of 1 or less, and in fact no significant difference in the optical properties can be observed.

Therefore, in the tandem solar cell 100, an amorphous silicon layer overdoped in the interface layer 136 is included as the junction layer 130, thereby maintaining the surface properties as hydrophobic without being affected by the optical properties.

Therefore, when the junction layer 130 is used as an ordinary conductive layer to apply TCO, a hydrophilic surface can be changed to hydrophobic by surface treatment or the interface layer, so that a coverage range with the first photoelectric conversion portion 110 formed above can be improved while the optical properties are maintained, thereby improving process matching and surface shape influence.

The features, structures, effects, and the like above are included in at least one embodiment of the present disclosure, and are not necessarily limited to only one embodiment. In addition, the features, structures, effects, and the like exemplified in various embodiments can also be implemented by combining or modifying other embodiments by those of ordinary skill in the art to which the embodiments belong. Therefore, content related to such combinations and modifications should be construed as being included in the scope of the present disclosure.

What is claimed is:

1. A solar cell, comprising:
   a photoelectric conversion portion, comprising a first photoelectric conversion portion comprising a photoelectric conversion layer formed of a perovskite compound, and a second photoelectric conversion portion comprising a semiconductor substrate;
   a junction layer, formed between the first photoelectric conversion portion and the second photoelectric conversion portion;
   a first electrode, electrically connected to the photoelectric conversion portion on one side of the photoelectric conversion portion; and
   a second electrode, electrically connected to the photoelectric conversion portion on the other side of the photoelectric conversion portion,
   wherein the junction layer comprises a back surface in contact with the second photoelectric conversion portion and a front surface in contact with the first photoelectric conversion portion, and the back surface and the front surface have different surface properties;
   wherein the back surface of the junction layer has a hydrophilic surface property and the front surface of the junction layer has a hydrophobic surface property.

2. The solar cell according to claim 1, wherein the second photoelectric conversion portion comprises the semiconductor substrate, a first-conductivity-type first semiconductor layer on one side of the semiconductor substrate, and a second-conductivity-type second semiconductor layer on the other side of the semiconductor substrate.

3. The solar cell according to claim 1, wherein the junction layer comprises a transparent conductive oxide (TCO) layer that is formed on the first-conductivity-type first semiconductor layer and has a hydrophilic surface property.

4. The solar cell according to claim 3, wherein a front surface of the TCO layer of the junction layer is formed by plasma surface treatment to have a hydrophobic surface property.

5. The solar cell according to claim 3, wherein the junction layer further comprises an interface layer in contact with the first photoelectric conversion portion on the TCO layer.

6. The solar cell according to claim 5, wherein the interface layer comprises a doped semiconductor layer and has a hydrophobic surface property.

7. The solar cell according to claim 5, wherein a tunneling layer is further comprised between the semiconductor substrate and the second-conductivity-type second semiconductor layer, and the interface layer is formed to be thinner than the tunneling layer.

8. The solar cell according to claim 7, wherein the first photoelectric conversion portion comprises the photoelectric conversion layer formed of the perovskite compound, a first transport layer formed above the photoelectric conversion layer, and a second transport layer formed below the photoelectric conversion layer, wherein the second transport layer is formed to be bonded to the junction layer, and
the second transport layer has a hydrophobic surface property.

9. The solar cell according to claim 8, wherein the second transport layer comprises N-propyl bromide (NPB) or 2,2',7,7'-tetra(N,N-di-p-tolyl)amino-9,9-spirobifluorene (Spiro-TTB) having a hydrophobic surface property.

10. The solar cell according to claim 1, wherein the first photoelectric conversion portion is positioned on one side of the second photoelectric conversion portion,
the first electrode is positioned on the first photoelectric conversion portion,
the second electrode is positioned on the second semiconductor layer of the second photoelectric conversion portion,
the second semiconductor layer comprises a polycrystalline portion, and
laminated structures of the first electrode and the second electrode are different from each other.

11. A method for manufacturing a solar cell according to claim 1, comprising:
forming a second photoelectric conversion portion comprising a semiconductor substrate, a first semiconductor layer on one side of the semiconductor substrate, and a second semiconductor layer having a different conductivity type from the first semiconductor layer on the other side of the semiconductor substrate;
forming a junction layer on the first semiconductor layer;
changing a surface property of a front surface of the junction layer;
forming a first photoelectric conversion portion on the front surface of the junction layer, wherein the photoelectric conversion layer comprises a photoelectric conversion layer formed of a perovskite compound; and
forming a first electrode electrically connected to the first photoelectric conversion portion on one side of the first photoelectric conversion portion and a second electrode electrically connected to the second photoelectric conversion portion on the other side of the second photoelectric conversion portion.

12. The method according to claim 11, wherein, during forming the junction layer, a TCO layer having a hydrophilic surface property is formed on the first semiconductor layer of the semiconductor substrate.

13. The method according to claim 12, wherein, during changing the surface property of the junction layer, a back surface of the junction layer is treated to have a hydrophilic surface property and the front surface of the junction layer is treated to have a hydrophobic surface property.

14. The method according to claim 13, wherein, during changing the surface property of the junction layer, a front surface of the TCO layer of the junction layer is subjected to plasma surface treatment to have a hydrophobic surface property.

15. The method according to claim 14, wherein the plasma surface treatment is performed with $CH_4$ plasma or fluorine plasma at a temperature below 200° C.

16. The method according to claim 13, wherein the step of changing a surface property of the junction layer further comprises:
a step of forming, on the TCO layer, an interface layer in contact with the first photoelectric conversion portion.

17. The method according to claim 16, wherein the forming of an interface layer comprises:
depositing an amorphous silicon layer on the TCO layer; and
injecting a high-concentration dopant to the amorphous silicon layer to change the surface property to hydrophobicity.

18. The method according to claim 17, wherein a tunneling layer is further comprised between the semiconductor substrate and the second semiconductor layer, and the interface layer is formed to be thinner than the tunneling layer.

19. The method according to claim 13, wherein the first photoelectric conversion portion is formed to comprise the photoelectric conversion layer formed of the perovskite compound, a first transport layer formed above the photoelectric conversion layer, and a second transport layer formed below the photoelectric conversion layer,
wherein the second transport layer is formed to be in contact with the junction layer, and
the second transport layer is formed by depositing a material having a hydrophobic surface property.

* * * * *